US008795545B2

(12) United States Patent
Heremans et al.

(10) Patent No.: US 8,795,545 B2
(45) Date of Patent: Aug. 5, 2014

(54) THERMOELECTRIC MATERIALS HAVING POROSITY

(75) Inventors: Joseph P. Heremans, Upper Arlington, OH (US); Christopher M. Jaworski, Columbus, OH (US); Vladimir Jovovic, Pasadena, CA (US); Fred Harris, Duncanville, TX (US)

(73) Assignees: ZT Plus, Azusa, CA (US); The Ohio State University, Columbus, OH (US)

( * ) Notice: Subject to any disclaimer, the term of this patent is extended or adjusted under 35 U.S.C. 154(b) by 180 days.

(21) Appl. No.: 13/436,521

(22) Filed: Mar. 30, 2012

(65) Prior Publication Data
US 2012/0248386 A1 Oct. 4, 2012

Related U.S. Application Data

(60) Provisional application No. 61/470,963, filed on Apr. 1, 2011, provisional application No. 61/509,088, filed on Jul. 18, 2011.

(51) Int. Cl.
*H01L 35/16* (2006.01)

(52) U.S. Cl.
USPC ........ 252/62.3 T; 264/614; 419/2; 136/236.1; 136/237; 136/238; 136/239; 136/240; 136/241

(58) Field of Classification Search
USPC .......................... 252/62.3 T; 264/614; 419/2; 136/236.1–241
See application file for complete search history.

(56) References Cited

U.S. PATENT DOCUMENTS

| | | |
|---|---|---|
| 2,027,534 A | 1/1936 | Ingersoll |
| 2,811,440 A | 10/1957 | Fritts et al. |
| 2,811,571 A | 10/1957 | Fritts et al. |
| 2,811,720 A | 10/1957 | Fritts et al. |
| 2,882,468 A | 4/1959 | Wernick |
| 3,004,393 A | 10/1961 | Alsing |
| 3,006,979 A | 10/1961 | Rich |
| 3,071,495 A | 1/1963 | Hanlein |
| 3,073,883 A | 1/1963 | McHugh et al. |
| 3,129,116 A | 4/1964 | Corry |
| 3,178,895 A | 4/1965 | Mole et al. |
| 3,224,876 A | 12/1965 | Fredrick |
| 3,238,134 A | 3/1966 | Fleischmann |
| 3,318,669 A | 5/1967 | Folberth |
| 3,505,728 A | 4/1970 | Hare et al. |
| 3,527,622 A | 9/1970 | Angus et al. |
| 3,607,444 A | 9/1971 | Debucs |
| 3,626,704 A | 12/1971 | Coe, Jr. |
| 3,663,307 A | 5/1972 | Mole |
| 3,945,855 A | 3/1976 | Skrabek et al. |
| 4,281,516 A | 8/1981 | Berthet et al. |
| 4,297,841 A | 11/1981 | Cheng |
| 4,420,940 A | 12/1983 | Buffet |
| 4,447,277 A | 5/1984 | Jayadev et al. |
| 4,499,329 A | 2/1985 | Benicourt et al. |
| 4,608,319 A | 8/1986 | Croopnick et al. |
| 4,730,459 A | 3/1988 | Schlicklin et al. |
| 4,989,626 A | 2/1991 | Takagi et al. |
| 5,006,178 A | 4/1991 | Bijvoets |
| 5,228,923 A | 7/1993 | Hed |
| 5,429,680 A | 7/1995 | Fuschetti |
| 5,439,528 A | 8/1995 | Miller |
| 5,448,109 A | 9/1995 | Cauchy |
| 5,584,183 A | 12/1996 | Wright et al. |
| 5,594,609 A | 1/1997 | Lin |
| 5,605,047 A | 2/1997 | Park et al. |
| 5,682,748 A | 11/1997 | DeVilbiss et al. |
| 5,726,381 A | 3/1998 | Horio et al. |
| 5,860,472 A | 1/1999 | Batchelder |
| 5,867,990 A | 2/1999 | Ghoshal |
| RE36,242 E | 6/1999 | Apisdorf |
| 5,929,351 A | 7/1999 | Kusakabe et al. |
| 5,955,772 A | 9/1999 | Shakouri et al. |
| 5,959,341 A | 9/1999 | Tsuno et al. |
| 6,000,225 A | 12/1999 | Choshal |
| 6,013,204 A | 1/2000 | Kanatzidis et al. |
| 6,060,657 A | 5/2000 | Harman |
| 6,082,445 A | 7/2000 | Dugan |
| 6,096,966 A | 8/2000 | Nishimoto et al. |

(Continued)

FOREIGN PATENT DOCUMENTS

| | | |
|---|---|---|
| CN | 1621389 A | 6/2005 |
| DE | 101 42 624 A1 | 4/2003 |

(Continued)

OTHER PUBLICATIONS

Translation for JP 2002-33525, Jan. 31, 2002.*
Ahmad, S., et al.: "Ab initio studies of the electric structure of defects in PbTe" Physical Review B, vol. 74, 2006, pp. 155205-1-155205-13.
Akimov, B. A., et al.: "Carrier Transport and Non-Equilibrium Phenomena in Doped PbTe and Related Materials" Review Article, Department of Low Temperature Physics, Faculty of Physics, M.V. Lomonossov Moscow State University, phys. stat. sol. (a) 127, 9 (1993) (pp. 9-55).

(Continued)

*Primary Examiner* — Carol M Koslow
(74) *Attorney, Agent, or Firm* — Knobbe, Martens, Olson & Bear LLP

(57) ABSTRACT

A thermoelectric material and a method of making a thermoelectric material are provided. In certain embodiments, the thermoelectric material comprises at least 10 volume percent porosity. In some embodiments, the thermoelectric material has a zT greater than about 1.2 at a temperature of about 375 K. In some embodiments, the thermoelectric material comprises a topological thermoelectric material. In some embodiments, the thermoelectric material comprises a general composition of $(Bi_{1-x}Sb_x)_u(Te_{1-y}Se_y)_w$, wherein $0 \le x \le 1$, $0 \le y \le 1$, $1.8 \le u \le 2.2$, $2.8 \le w \le 3.2$. In further embodiments, the thermoelectric material includes a compound having at least one group IV element and at least one group VI element. In certain embodiments, the method includes providing a powder comprising a thermoelectric composition, pressing the powder, and sintering the powder to form the thermoelectric material.

43 Claims, 16 Drawing Sheets

(56) References Cited

U.S. PATENT DOCUMENTS

| | | | |
|---|---|---|---|
| 6,103,967 A | 8/2000 | Cachy et al. |
| 6,225,548 B1 | 5/2001 | Sakakibara et al. |
| 6,225,550 B1 | 5/2001 | Hornbostel et al. |
| 6,312,617 B1 | 11/2001 | Kanatzidis et al. |
| 6,334,311 B1 | 1/2002 | Kim et al. |
| 6,346,668 B1 | 2/2002 | McGrew |
| 6,347,521 B1 | 2/2002 | Kadotani et al. |
| 6,367,261 B1 | 4/2002 | Marshall et al. |
| 6,401,462 B1 | 6/2002 | Bielinski |
| 6,444,894 B1 | 9/2002 | Sterzel |
| 6,446,442 B1 | 9/2002 | Batchelor et al. |
| 6,452,206 B1 | 9/2002 | Harman et al. |
| 6,477,844 B2 | 11/2002 | Ohkubo et al. |
| 6,509,066 B1 | 1/2003 | Jost |
| 6,530,842 B1 | 3/2003 | Wells et al. |
| 6,539,725 B2 | 4/2003 | Bell |
| 6,563,039 B2 | 5/2003 | Caillat et al. |
| RE38,128 E | 6/2003 | Gallup et al. |
| 6,617,504 B2 | 9/2003 | Kajihara et al. |
| 6,625,990 B2 | 9/2003 | Bell |
| 6,637,210 B2 | 10/2003 | Bell |
| 6,672,076 B2 | 1/2004 | Bell |
| 6,812,395 B2 | 11/2004 | Bell |
| 6,845,710 B2 | 1/2005 | Hinzpeter et al. |
| 6,858,154 B2 | 2/2005 | Suzuki et al. |
| 6,883,359 B1 | 4/2005 | Hartwig, Jr. |
| 6,948,321 B2 | 9/2005 | Bell |
| 6,959,555 B2 | 11/2005 | Bell |
| 7,111,465 B2 | 9/2006 | Bell |
| 7,231,772 B2 | 6/2007 | Bell |
| 7,273,981 B2 | 9/2007 | Bell |
| 7,326,851 B2 | 2/2008 | Sterzel et al. |
| 7,342,169 B2 | 3/2008 | Venkatasubramanian et al. |
| 7,365,265 B2 | 4/2008 | Heremans et al. |
| 7,426,835 B2 | 9/2008 | Bell |
| 7,465,871 B2 | 12/2008 | Chen et al. |
| 7,847,179 B2 | 12/2010 | Kanatzidis et al. |
| 7,932,460 B2 | 4/2011 | Bell |
| 7,952,015 B2 | 5/2011 | Sterzel et al. |
| 8,083,986 B2 | 12/2011 | Choi et al. |
| 2001/0029974 A1 | 10/2001 | Cohen et al. |
| 2003/0056819 A1 | 3/2003 | Imai et al. |
| 2003/0094265 A1 | 5/2003 | Chu et al. |
| 2004/0107988 A1 | 6/2004 | Harman et al. |
| 2004/0261829 A1 | 12/2004 | Bell |
| 2004/0261833 A1 | 12/2004 | Ono et al. |
| 2005/0076944 A1 | 4/2005 | Kanatzidis et al. |
| 2005/0241690 A1 | 11/2005 | Tajima et al. |
| 2006/0102224 A1 | 5/2006 | Chen et al. |
| 2006/0118158 A1 | 6/2006 | Zhang et al. |
| 2006/0151871 A1 | 7/2006 | Mehrotra |
| 2006/0243314 A1 | 11/2006 | Ota et al. |
| 2006/0249704 A1 | 11/2006 | Ren et al. |
| 2007/0028956 A1 | 2/2007 | Venkatasubramanian et al. |
| 2007/0107764 A1 | 5/2007 | Kanatzidis et al. |
| 2007/0240749 A1 | 10/2007 | Ohtaki |
| 2008/0289677 A1 | 11/2008 | Bell et al. |
| 2009/0178700 A1 | 7/2009 | Heremans et al. |
| 2009/0235969 A1 | 9/2009 | Heremans et al. |
| 2009/0269584 A1 | 10/2009 | Bell et al. |
| 2010/0258154 A1 | 10/2010 | Heremans |
| 2011/0042607 A1 | 2/2011 | Kanatzidis et al. |
| 2011/0220163 A1 | 9/2011 | Bell |
| 2011/0248209 A1 | 10/2011 | Androulakis |

FOREIGN PATENT DOCUMENTS

| | | |
|---|---|---|
| EP | 0 455 051 | 11/1991 |
| EP | 455051 | * 11/1991 |
| EP | 0 874 406 | 10/1998 |
| EP | 1 102 334 | 5/2001 |
| GB | 894 307 | 4/1962 |
| GB | 2 027 534 | 2/1980 |
| GB | 2 267 338 | 12/1993 |
| JP | 56-18231 | 2/1981 |
| JP | 4-165234 | 6/1992 |
| JP | 5-219765 | 8/1993 |
| JP | 09-074229 | 3/1997 |
| JP | 11-97751 | * 4/1999 |
| JP | 2000-164940 | 6/2000 |
| JP | 2002-033525 | 1/2002 |
| JP | 2002-33525 | * 1/2002 |
| JP | 2002-289930 | 10/2002 |
| JP | 2003-225743 | 8/2003 |
| JP | 2008-523579 | 7/2008 |
| JP | 2009-133636 | * 6/2009 |
| SE | 329 870 | 10/1970 |
| WO | WO 94/01893 | 1/1994 |
| WO | WO 98/44562 | 10/1998 |
| WO | WO 00/24040 | 4/2000 |
| WO | WO 2004/090998 | 10/2004 |
| WO | WO 2005/036660 | 4/2005 |

OTHER PUBLICATIONS

Alekseeva, G. T., et al.: "Hole Concentration and Thermoelectric Figure of Merit for Pb1-xSnxTe: Te Solid Solutions," Semiconductors, Vo. 34, No. 8, 2000, pp. 897-901.

Androulakis, et al.: "High-temperature thermoelectric properties of n-type PbSe doped with Ga, In, and Pb", Physical Review B, vol. 83, 2011 (XP000002658756).

Androulakis, et al.: "Thermoelectric enhancement in PbTe with K, Na co-doping from tuning the interaction of the light and heavy hole valence bands", Condensed Matter, vol. 2010, Jul. 9, 2010. (XP000002658753).

Androulakis, et al.: "Thermoelectric enhancement in PbTe with K, Na co-doping from tuning the interaction of the light and heavy hole valence bands", Physical Review B, vol. 82, No. 11, 2010 (XP000002658754).

Androulakis, et al.: High thermoelectric efficiency in co-doped degenerate p-type PbTe, Mater. Res. Soc. Symp. Proc., vol. 1267, 2010 (XP000002658755).

Androulakis, John et al.,: "Nanostructuring and High Thermoelectric Efficiency in p-Type Ag(Pb1-ySny) mSbTe2+m" Wiley InterScience, Advanced Materials, 2006, 18, 1170-1173, Wiley-VCH Verlag GmbH & Co. KGaA, Weinheim.

Angrist, S. W., "Direct Energy Conversion", 3rd Edition, Ed. Ally & Bacon (1976).

Armstrong, R. W., et al.: "A Structural Study of the Compound AgSbTe2", Journal of Applied Physics, vol. 31, No. 11, Nov. 1960, pp. 1954-1959.

Bazakutsa, V. A., et al.: "Thermal Conductivity of Triple Semiconductors of $A^1SbC^6_2$ Type as a Function of Chemical Composition and Structure", J. Eng. Phys. 34, 127-140 (1978).

Bell, L. E.: "Alternate Thermoelectric Thermodynamic Cycles with Improved Power Generation Efficiencies", Proceedings ICT '03, 22nd International Conference on Thermoelectrics, La Grande Motte, France, Aug. 17-21, 2003.

Bell, L.E., "Increased Thermoelectric System Thermodynamic Efficiency by Use of Convective Heat Transport," Proc. 21st Int'l Conf. on Thermoelectrics, Long Beach, CA (Aug. 2002).

Bell, L.E., "Use of Thermal Isolation to Improve Thermoelectric System Operating Efficiency," Proc. 21st Int'l Conf. on Thermoelectrics, Long Beach, CA (Aug. 2002).

Bergmann, V. G.: "Untersuchungen über die Dotierungseigenschaften der Elemente Germanium und Blei in Wismuttellurid Bi2Te3*", Z. Ruer Naturforsch, vol. 18a, Issue 11, 1963, pp. 1169-1181.

Björgvinsson, et al.: "Multinuclear magnetic resonance study of the dilead trichalcogenide anions Pb2SnCh2-n2-(Ch—Se or Te), Pb2SSeTe2-, and M2Se32- (M=Sn and /or Pb) and the crystal structures of (2,2,2-crypt-K+)2Sn2Te32- and (2,2,2-crypt-K+)2Sn2Se32-", Inorganic Chemistry, vol. 32, No. 26, Dec. 1, 1993 (XP55006865).

Borissova et al., Thermoelectric properties of materials based on PbTe and GeTe, 1st Eur. Conf. Thermoelec., Cardiff, Sep. 15-17, Chapter 15, pp. 171-177 (1988).

(56) References Cited

OTHER PUBLICATIONS

Buist, R., et al. "Theoretical Analysis of Thermoelectric Cooling Performance Enhancement Via Thermal and Electrical Pulsing", Journal of Thermoelectricity, No. 4, 1996.
Buist, R.J.. et al. "A New Concept for Improving Thermoelectric Heat Pump Efficiency", Borg-Warner Thermoelectrics Wolf and Algonquin Road, pp. 60-63, 1976.
Bushmarina, G. S., et al.: "Stabilization of the Fermi level in gallium-doped Pb1-x GexTe solid solutions", Sov. Phys. Semicond. 11(10), Oct. 1977, American Institute of Physics 1978, pp. 1098-1102.
Caillat, T. et al., "Development of High Efficiency Segmented Thermoelectric Unicouples," 20th Int'l Conf. on Thermoelectrics (2001).
Caillat, T. et al.: "Study of the Bi-Sb-Te Ternary Phase Diagram", J. Phys. Chem. Solids vol. 53, No. 2, pp. 227-232, 1992.
Choi, J.-S. et al., "Thermoelectric Properties of n-Type (Pbl-xGex)Te Fabricated by Hot Pressing Method" Proc. 16th International Conference on Thermoelectrics, 228-231. (1997).
CRC Handbook of Thermoelectrics, ed. D.M. Rowe, Chapter 54, Medium-Scale Cooling: Thermoelectric Technology and Chap. 55, Modeling of Thermoelectric Cooling Systems, (ISBN: 0-8493-0146-7), Jul. 1995, pp. 667-683.
Darrow, M.S., et al.: "Phase Relations in the System PbS-PbTe", Transactions of the Metallurgical Society of AIME, 654—vol. 236, May 1996.
Dashevsky, et al.: "Optimization of Thermoelectric Efficiency in Graded Materials", 22nd International Conference on Thermoelectrics. 2003 IEEE.
DeYoreo et al., Principles of Crystal Nucleation and Growth, Biomineralization, vol. 54, Weiner Mineralogical Society of America, pp. 57-93, 2003.
Dimmock, J. O., et al.: "Band Structure and Laser Action in PbxSn1-xTe" Physical Review Letters, vol. 16, No. 26, pp. 1193-1196, Jun. 27, 1996.
Dismukes, J.P. et al.: "Lattice Parameter and Density in Germanium-Silicon Alloys", RCA Laboratories, Radio Corporation of America, Princeton, New Jersey, vol. 68, No. 10, Oct. 1964, pp. 3021-3027.
Dughaish, Z. H.: "Lead telluride as a thermoelectric material for thermoelectric power generation", Physica B 322 (2002) 205-223.
Ebling, et al.: "Influence of Group IV-Te Alloying of Nanocomposite Structure and Thermoelectric Properties of Bi2 Te3 Compounds", Journal of Electronic Materials, vol. 38, No. 7, 2009, pp. 1450-1455.
Gelbstein Y., et al.: "In-doped Pb0.5Sn0.5Te p-type samples prepared by powder metallurgical processing for thermoelectric applications" Physica B, vol. 396, Jan. 1, 2007 pp. 16-21.
Gelbstein, et al.: "High Performance n-type PbTe-based materials for thermoelectric applications", Elsevier, Science Direct, Physica B, vol. 363 (2005) 196-205.
Gelbstein et al.: "Powder metallurgical processing of functionally graded p-PblxSnxTe materials for thermoelectric applications", Elsevier, Science Direct, Physica B, 391 (2007) 256-265.
Geller, S., et al.: "Ternary Semiconducting Compounds with Sodium Chloride-Like Structure: AgSbSe2, AgSbTe2, AgBiS2, AgBiSe2", Ternary Semiconducting Compounds, Acta Cryst. (1959) 12, pp. 46-54.
Goldsmid, H.J., "Electronic Refrigeration", Pion Ltd, 207 Brondesbury Park, London (1986).
Golubev, V. G., et al.: "Electrical properties of Pb1-xlnxTe solid solutions at liquid helium temperature", Sov. Phys. Semicond. 11(9) Sep. 1977, American Institute of Physics 1978, pp. 1001-1003.
Goodman, C.H.L., et al.: "New Semiconducting Compounds of Diamond Type Structure", Research Laboratories the General Electric Co. Ltd., Wembley, Middlesex, England, Physica XX, No. 11, Amsterdam Conference Semiconductors (1954) pp. 1107-1109.
Guéguen, A., et al.: "Thermoelectric Properties and Nanostructuring in the p-Type Materials NaPb18-xSnxMTe20 (M=Sb, Bi)", Chem. Mater. 2009, 21, 1683-1694 American Chemical Society.
Harman, Ted, et al., "Quantum Dot Superlattice Thermoelectric Materials and Devices," Science, p. 297, 2229 (2002).

Hebert, R.J. And Perepezko, J.H., "Structural Transformations in Crystalline and Amorphous Multilayer Samples During Cold Rolling," Scripta Materialia, vol. 49, pp. 933-939 (2003).
Heremans, et al.: "Thermopower enhancement in PbTe with Pb precipitates", Journal of Applied Physics 98, 063703 (2005).
Heremans, J. P., et al.: "Enhancement of Thermoelectric Efficiency in PbTe by Distortion of the Electric Density of States", Science 321, 554 (2008), in six pages.
Hoang, Khang, et al.: "Atomic Ordering and Gap Formation in Ag-Sb-Based Ternary Chalcogenides" Physical Review Letters, American Physical Society, New York, US, vol. 99, No. 15, Oct. 12, 2007 pp. 156403-1, ISSN: 0031-9007.
Hockings, E.F.: "The thermal conductivity of silver antimony telluride", Letters to the Editors, 1959, pp. 341-342.
Hsu, K.F., et al.: "Cubic AgPbmSbTe2+m: bulk thermoelectric materials with high figure of merit" Science, vol. 303, Feb. 6, 2004, pp. 818-821.
Hsu, K.F., et al.: "Thermoelectric Properties of the cubic AgPb10SbTe12" Mat. Res. Soc. Symp. Proc. vol. 793, 2004 Materials Research Society, pp. S6.3.1-S6.3.6.
Ikoma, K., et al., "Thermoelectric Module and Generator for Gasoline Engine Vehicles," 17th Int'l Conf. on Thermo-electrics, Nagoya, Japan,pp. 464-467 (1998).
Jacquot, Fraunhofer Institute, Department of Component and Microsystems, Heidenhofstraβe 8, 79110 Freiburg, Germany, "Measuring Methods Applicable to Thermoelectric Materials: Fraunhofer-IPM Capabilities and Services," 25th Intl Conf. on Thermoelectrics, Vienna, Austria, 2006.
Jaworski, C. M., et al.: "Resonant level formed by tin in Bi2Te3 and the enhancement of room-temperature thermoelectric power", Physical Review B 80, 1 (2009), pp. 1-1 to 1-4.
Jaworski, C. M.: "An Investigation into Lead Telluride Lead Sulfide Composites and Bismuth tin Telluride Alloys for Thermoelectric Applications", Thesis presented in the Graduate School of the Ohio State University, Dec. 2008.
Jovovic, V., et al.: "Low temperature thermal, thermoelectric and thermomagnetic transport in indium rich Pb1-xSnxTe alloys", The Ohio State University, Columbus, OH 43210, USA, J. of Applied Physics (103) 053710 (2008), in 7 pages.
Jovovic, V., et al.: High-Temperature Thermoelectric Properties of Pb1-xSnxTe:In, Mater. Res. Soc. Symp. Proc. vol. 1044, 2008.
Kaïdanov, V. I., et al.: "Deep and resonance states in AIVBVI semiconductors", Sov. Phys. Usp. 28(1), Jan. 1985, American Institute of Physics 1985, pp. 31-53.
Kaïdanov, V. I., et al.: "Influence of resonant scattering of carriers on the transport coefficients in the absence of a magnetic field", Sov. Phys. Semicond. 20(6), Jun. 1986, American Institute of Physics 1986, pp. 693-694.
Kaïdanov, V. I., et al.: "New quasilocal level in PbTe:Tl containing excess lead", Sov. Phys. Semicond. 20(5), May 1986, American Institute of Physics 1986, pp. 541-543.
Kaïdanov, V. I., et al.: "Resonant scattering of carriers in IV-VI semiconductors", Sov. Phys. Semicond. 26(2), Feb. 1992, American Institute of Physics 1992, pp. 113-125.
Kohler, H.: "Non-Parabolicity of the Highest Valence Band of Bi2Te3 from Shubnikov-de Haas Effect". Physikalisches Institut der Universtat Wurzburg, phys. stat. sol (b) 74, 591 (1976) pp. 591-600.
Kohri H., et al., "Improvement of thermoelectric properties for n-type PbTe by adding Ge" Materials Science Forum Trans Tech Publications Switzerland, vol. 423-425, 2003, pp. 381-384.
Kudman, I.: "Thermoelectric properties of p-type PbTe-PbSe alloys", Journal of Materials Science 7 (1972) 1027-1029.
Kulbachinskii, V. A., et al.: "Quantum Oscillations of Hall Resistance. Magnetoresistance in a Magnetic Field up to 54T and the Energy Spectrum of Sn Doped Layered Semiconductors", Semiconductor Science and Technology, No. 17, Sep. 22, 2002, pp. 1133-1140 (XP002585361).
Kulbachinskii, V. A., et al.: "Thermoelectric Power and Scattering of Carriers in Bi2—xSnxTe3 with Layered Structure", phys. Stat. sol. (b) 199, 505 (1997).
Kulbachinskii, V. A., et al.: "Valence-band energy spectrum of solid solutions of narrow-gap-semiconductor Bi2-xSxTe3 single crystals", Physical Review B, vol. 50, No. 23, Dec. 15, 1994, pp. 16921-16930.

(56) References Cited

OTHER PUBLICATIONS

Kulbachinskiĭa, et al.: "Fermi Surface and Thermoelectric Power of (Bi1-xSBx)2Te3<Ag,Sn> Mixed Crystals", in Fizika Tverdogo Tela, 2006, vol. 48, No. 5, pp. 594-601.

Kullerud, The Lead Sulfur System, American Journal of Science, Schairer vol. 267-A, pp. 233-256, 1969.

Lalonde, A.D., et al.: "Synthesis and Characterization of p-Type Pb0.5 Sn0.5Te Thermoelectric Power Generation Elements by Mechanical Alloying," Journal of Electronic Materials, vol. 39, No. 1, 2010.

Lashkaraev G. V., et al., "Hot wall growth and properties of lead telluride films doped by germanium and gallium" Semiconductor Physics Quantum Electronics & Optoelectronics Natl. Acad. Sci. UKR Ukraine, vol. 3, No. 3, Jun. 2000, pp. 295-299, Ukraine ISSN: 1560-8034.

Lawson et al., Preparation and properties of HgTe and mixed crystals of Hg Te-CdTe, Phys. and Chem. Solids, 9, pp. 325-329 (1959) ( 1 page abstract only).

Lewandowska, M.: "Hydrostatic extrusion and nanostructure formation in an aluminum alloy," poster at E-MRS Fall Meeting 2003, Symposium G.

Long, C., et al: "Preparation and thermoelectric properties of N-type PbTe doped with in and Pb12" Rogl, P. F.,: 25th International Conference on Thermoelectrics, Aug. 6-10, 2006 (IEEE Cat. No. 06TH8931C) Piscataway, NJ, USA ISBN 1-4244-0811-3:, Aug. 10, 2006, pp. 382-385.

Mahan, G. D., et al.: "The best thermoelectric", Proc. Natl. Acad. Sci. USA, vol. 93, pp. 7436-7439, Applied Physical Sciences, Jul. 1996.

Marlow Industries, Inc., 10451 Vista Park Rd., Dallas, TX 75238, USA, "Electrical Resistivity and Seebeck Coefficient of Segmented Thermoelectrics," 25th Int'l Conf. on Thermoelectrics, Vienna, Austria, 2006.

Matsushita, et al.: "Phase diagram and thermoelectric properties of Ag 3-xSb1+xTe4 system", Journal of Materials Science 39 (2004) 6299-6301.

McGraw Hill online Science dictionary "shearing stress" downloaded from www.accessscience.com on Aug. 2, 2010.

Middendorf von, A., et al.: "Evidence for a Second Valence Band in p-Type Bi2 Te3 From Magneto-Seebeck and Shubnikov-De Haas-Data", Physikalisches Institut der universität Würzburg, Würzburg, Germany, Mar. 30, 1972, in five pages.

Miner, A., et al. "Thermo-Electro-Mechanical Refrigeration Based on Transient Thermoelectric Effects", Applied Physics letters, vol. 75, pp. 1176-1178 (1999).

Miyajima, N., et al.: "Possible Mechanism of a New Type of Three-Dimensional Quantized Hall Effect in Layered Semiconductors Bi2-xSnxTe3", Journal of Low Temperature Physics, Vo. 123, Nos. ¾, 2001, pp. 219-238.

Morelli, et al., "Intrinsically Minimal Thermal Conductivity in Cubic I-V-VI2 Semiconductors", Physical Review Letters, PRL 101, 035901, 2008, in 4 pages.

Willer, E., et al., "Separated Effect of 1D Thermoelectric Material Gradients," 25th Int'l Conf. on Thermoelectrics, Vienna, Austria (2006).

Nemov, S. A. et al.: "Density of Localized States in (Pb0.78Sn 0.22) 0.95In0.05Te Solid Solutions", Electronic and Optical Properties of Semiconductors, Semiconductors, vol. 35, No. 10, 2001, pp. 1144-1146.

Nemov, S. A., et al.: "Characteristics of the energy spectrum of Pb1-xSnx Te:Tl:Na" M. I. Jalinin Polytechnic Institute Leningrad, Sov. Phys. Semicond. 24(8), Aug. 1990, pp. 873-876.

Nemov, S. A., et al.: "Self-compensation of electrically active impurities by intrinsic defects in (Pb.sub.0.8Sn.sub.0.2)Te solid solutions" State Technical University, St. Petersburg, A.F. Ioffe Physicotechnical Institute, Russian Academy of Sciences, St. Petersburg, Sov. Phys. Semicond. 26(8), Aug. 1992, pp. 839-842.

Nemov, S. A., et al.: "Transport phenomena in Pb.sub.0.78Sn.sub.0. 22Te with high In impurity concentrations", Semiconductors 27(2), Feb. 1993, American Institute of Physics 1993, pp. 165-168.

Orihashi, M., et al.: "Effect of tin content on thermoelectric properties of p-type lead tin telluride," Journal of Physics and Chemistry of Solids 61 (2000) 919-923.

Partin, D.L., "Growth of lead-germanium-telluride thin film structures by molecular beam epitaxy" J. Vac. Sci. Technol., 21(1), May/Jun. 1982, p. 1-5.

Plecháček, T., et al.: "Defect structure of Pb-doped Bi2Te3 single crystals", Philosophical Magazine, vol. 84, No. 21, Jul. 21, 2004, pp. 2217-2227.

Poudeu, P. F., et al.: "High temperature figure of merit and nanostructuring in bulk p-type NaI-xPbmSbyTem+2" vol. 45, 2006, pp. 3835-3839.

Quarez, Eric et al., "Nanostructuring, Compositional Fluctuations, and Atomic Ordering in the Thermoelectric Materials AgPbmSbTe2+m. The Myth of Solid Solutions" Journal of the American Chemical Society, American Chemical Society, Washington, DC, US, vol. 127, Jan. 1, 2005 pp. 9177-9190, ISSN:0002-7863.

Ravich, Y. I., et al.: "Applications of Lead Chalcogenides", Semiconducting Lead Chalcogenides, 1970 Chapter VII, Sec. 7.1, pp. 328, 329.

Rogacheva, E. I., et al., "Concentration anomalies of properties in Pb1-xGexTe solid solutions" XP002296049 Database accession No. 4554393 abstract& XXII International School on Physics of Semiconducting Compounds May 22-28, 1993 Jaszowiec, Poland, vol. 84, No. 4, May 22, 1992, pp. 729-732, Acta Physica Polonica A Poland ISSN: 0587-4246 (The Institution of Electrical Engineers, Stevenage, GB; Oct. 1993.

Rosi, F. D., et al.: "Semiconducting materials for thermoelectric power generation" RCA Review, vol. 22, Mar. 1, 1961, pp. 82-121, RCA Corporation, US ISSN: 0033-6831.

Scherrer, H., et al.: "Thermoelectric Materials", Bismuth Telluride, Antimony Telluride, and Their Solid Solutions, Chapter 19, pp. 211-255, 1995.

Scoville N., et al.: "Thermal conductivity Reduction in SiGe Alloys by the Addition of Nanophase Particles", NanoStructured Materials, vol. 5, No. 2, p. 207-223, 1995. XP004174904 ISSN: 0965-9773.

Semeniouk, et al., "Single Stage Thermoelectric Coolers with Temperature Difference of 80 K", International Conference on Thermoelectrics. St. Petersburg, Russia, pp. 485-489, 1995.

Shakouri, Ali, et al., "Cooling Enhancement Using Inhomogeneous Thermoelectric Materials," 25th Intl Conf. on Thermoelectrics, Vienna, Austria (2006).

Shamsuddin et al.: "Thermodynamic and Constitutional Studies of the Pb Te-GeTe System", Journal of Materials Science, vol. 10, pp. 1849-1855, 1975.

Shinohara, et al., "Thermoelectric Properties of Segmented Pb-Te Systems with Graded Carrier Concentrations," 16th Intl Conf. on Thermoelectrics, 1997.

Shoemake, G. E., et al.: "Specific Heat of n- and p-Type Bi2Te3 from 1.4 to 90° K*", Physical Review, vol. 185, No. 3, Sep. 15, 1969, pp. 1046-1056.

Snyder, et al., "Thermoelectric Efficiency and Compatibility", Physical Review Letters, vol. 91, No. 14, 2003.

Snyder, J.G., "Thermoelectric Power Generation: Efficiency and Compatibility," Thermoelectrics Handbook, Macro to Nano, Edited by D.M. Rowe, Ph.D., D.Sc., 2006.

Stambaugh, et al.: "Final Summary Report on Development on Improved Thermoelectric Materials for Spacecraft Applications", Battelle Memorial Institute, Contract No. NAS8-11452, Control No. DCN 1-4-50-01159-01 & S1 (1F), dated Jun. 25, 1965.

Tada, S., et al., "A New Concept of Porous Thermoelectric Module Using a Reciprocating Flow for Cooling/Heating Systems (Numerical Analysis for Heating Systems)" 16th International Conference on Thermoelectrics (1977).

Tang, Xinfeng, et al., Wuhan University of Technology, Wuhan 430070, People's Republic of China, "Preparation and Thermoelectric Transport Properties of High-Performance p-type Bi2Te3 with Layered Nanostructure," American Institute of Physics, Applied Physics Letters, p. 90, 012102-1, 2007.

Veĭs, A. N., et al.: "Investigation of the impurity states of thallium lead selenide", Sov. Phys. Semicond., vol. 11, No. 5, May 1977, American Institute of Physics 1977, pp. 588-589.

(56) References Cited

OTHER PUBLICATIONS

Venkatasubramanian, Rama, et al., "Thin-film Thermoelectric Devices With High Room-Temperature Figures of Merit," Nature, p. 413, 597 (2001).

Volkov, B. A., et al.: "Mixed-valence impurities in lead telluride-based solid solutions", Physics-Uspekhi 45 (8) 819-846 (2002), Uspekhi Fizicheskikh Nauk, Russian Academy of Sciences 2002.

Wernick, J. H., et al.: "New semiconducting ternary compounds", Phys. Chem. Solids 3, Letters to the Editor, 1957, pp. 157-159.

Wernick, Metallurgy of some ternary semiconductors and constitution on the AgSbSe2-AgSbTe2-AgBiSe-PbSe-PbTe system, Bell Telephone Laboratories, Inc., Murray Hill, New Jersey, pp. 69-88 (1960).

Wolfe, R., et al.: "Anomalous Hall Effect in AgSbTe2", Journal of Applied Physics, vol. 31, No. 11, Nov. 1960, pp. 1959-1964.

Wood, C., et al.: "Review Article; Materials for thermoelectric energy conversion" Reports on Progress in Physics, Institute of Physics Publishing, Bristol, GB, vol. 51, No. 4, Apr. 1, 1988 pp. 459-539, ISSN: 0034-4885 pp. 496,499.

Yin, et al.: "Preparation and electrical transport properties of n-type GaxPb1-xTe compounds", 2007 International Conference on Thermoelectrics.

Zhitinskaya, M. K., et al.: "Influence of Sn Resonance States on the Electrical Homogeneity of Bi2Te3 Single Crystals", Semiconductors, vol. 34, No. 12, 2000, pp. 1363-1364.

Zhitinskaya, M. K., et al.: "Properties of the Electron and Phonon Sub-systems of Tin-doped Bismuth Telluride-based Solid Solutions", 7th European Workshop on Thermoelectrics, 2002, Pamplona, Spain, 5 pages.

Zhitinskaya, M. K., et al.: "Specific features of Bi2Te3 doping with Sn", Physics of the Solid State, vol. 40, No. 8, Aug. 1998, pp. 1297-1300.

Zhitinskaya, M. K., et al.: "Thermal Conductivity of Bi2Te3 : Sn and the Effect of Codoping by Pb and I Atoms", Physics of the Solid State, vol. 45, No. 7, 2003, pp. 1251-1253.

Zhu T. J., et al.: "Nanostructuring and Thermoelectric Properties of Semiconductor Tellurides", Thermoelectrics, 2007, ICT 2007, 26th International Conference on, IEEE, Piscataway, NJ, USA, pp. 8-11. XP031288452 ISBN: 978-1-4244-2262-3.

Zhuze, V. P., et al.: "Semiconducting Compounds With the General Formula ABX2", Soviet Physics, Technical Physics, vol. 3, No. 10, Oct. 1958, pp. 1925-1938.

International Search Report and Written Opinion re PCT Application No. PCT/US2012/031636, mailed Nov. 16, 2012.

Wang, et al.: "High performance n-type (B,Sb)₂(Te,Se)₃ for low temperature thermoelectric generator," J. Phys. D: Appl. Phys. 43 (2010) 335404 (8 pages).

Ravich et al., "Semiconducting Lead Chalcogenides," Chap. IV, Sec. 4.2, pp. 196-213, 1970.

Ravich, Y. I., et al.: "Selective Carrier Scattering in Thermoelectric Materials," General Principles and Theoretical Considerations, CRC Press, Inc. pp. 67-73, 1995.

International Preliminary Report on Patentability, re PCT Application No. PCT/US2012/031636, issued Oct. 1, 2013.

\* cited by examiner

Figure 1
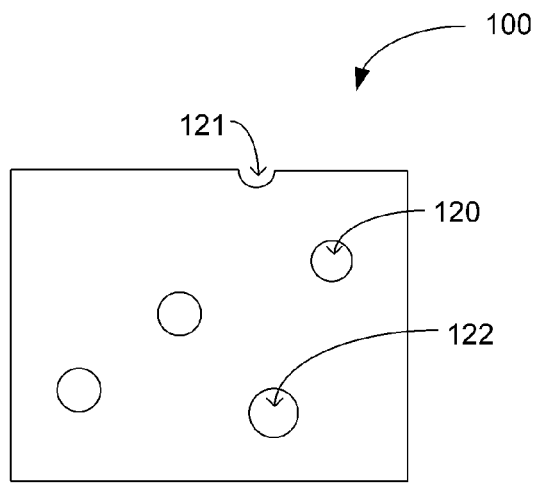
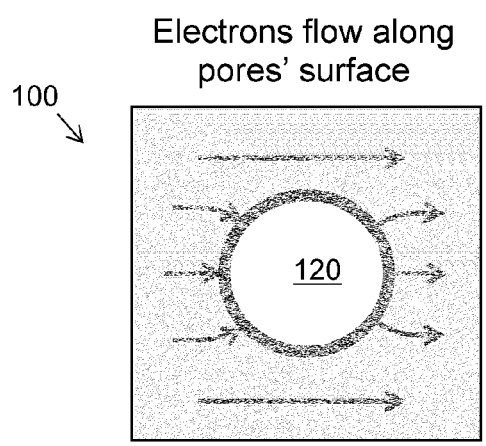
Figure 2A
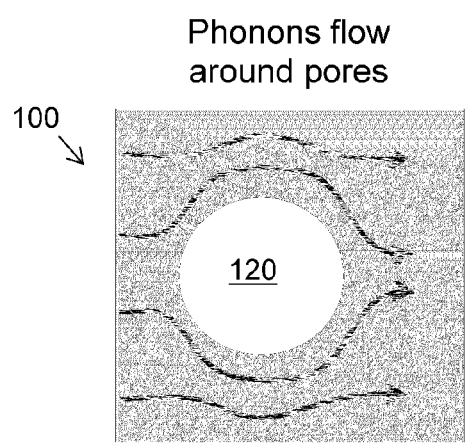
Figure 2B

US 8,795,545 B2

THERMOELECTRIC MATERIALS HAVING POROSITY

STATEMENT REGARDING FEDERALLY SPONSORED R&D

This invention was made with government support under grant number 10-B-DOE100109-001 awarded by the U.S. Department of Energy. The Government has certain rights in the invention.

This application claims the benefit of U.S. Provisional Patent Application No. 61/470,963, filed Apr. 1, 2011; and U.S. Provisional Patent Application No. 61/509,088, filed Jul. 18, 2011. Each of the foregoing applications is incorporated in its entirety by reference herein.

BACKGROUND

1. Field of the Invention

The present application relates generally to thermoelectric materials, and more specifically to thermoelectric materials having porosity.

2. Description of the Related Art

Thermoelectric (TE) materials can be used in power generation mode by converting heat into electrical power directly, or can be used in cooling (Peltier) mode by converting a voltage difference into a temperature difference. TE coolers and generators are solid-state motionless devices, and thus extremely compact and reliable. Doubling their efficiency may pave the way for their widespread use in waste heat recovery and refrigeration (L. Bell, "Cooling, heating, generating power, and recovering waste heat with thermoelectric systems," *Science*, Vol. 321, 1457-1461 (September 2008)). TE technology then promises to contribute significantly to world-scale energy conservation efforts.

The device efficiency is determined primarily by the thermoelectric figure of merit zT of the TE materials of the device. The value of zT is currently about 1 in commercial materials and has reached 1.5 and greater using nano-structuring to reduce the thermal conductivity (M. Kanatzidis, "Nanostructured thermoelectrics: the new paradigm?" *Chem. Mater.* Vol. 22, 648-659 (2010)), and band structure engineering (G. D. Mahan, "Good Thermoelectrics" in *Solid State Physics* (eds. H. Ehrenreich and F. Spaepen) Vol. 51, 81-157 (Academic, NY, 1998)) such as the use of resonant impurity levels (J. Heremans, V. Jovovic, E. Toberer, A. Saramat, K. Kurosaki, A. Charoenphakdee, S. Yamanaka, and G. Synder, "Enhancement of thermoelectric efficiency in PbTe by distortion of the electronic density of states," *Science* Vol. 321, 554-557 (July 2008)) to increase the thermoelectric power.

SUMMARY

In certain embodiments, a thermoelectric material is provided. The thermoelectric material can include at least 10 volume percent porosity. For example, in some embodiments, the they material includes about 10 to about 40 volume percent porosity. As another example, the thermoelectric material includes about 15 to about 25 volume percent porosity. A substantial portion of the porosity of the thermoelectric material can be closed. A substantial portion of the porosity can have a size that is between about 50 nanometers and about 10 microns, between about 0.1 micron and about 1 micron, or between about 1 micron and about 10 microns. A substantial portion of the porosity of the thermoelectric material can have a size that is larger than at least one of an electron mean free path of the thermoelectric material and a phonon mean free path of the thermoelectric material. In certain embodiments of thermoelectric materials including at least about 10 volume percent porosity, the thermoelectric material can have a zT greater than about 1.2 at a temperature of about 250 K, of about 275 K, of about 300 K, of about 325 K, of about 350 K, of about 375 K, or of about 400 K.

In some embodiments, the thermoelectric material includes a general composition of $(Bi_{1-x}Sb_x)_u(Te_{1-y}Se_y)_w$, where $0 \leq x \leq 1$, $0 \leq y \leq 1$, $1.8 \leq u \leq 2.2$, $2.8 \leq w \leq 3.2$. For example, the thermoelectric material can include a general composition of $(Bi_{1-x}Sb_x)_u(Te_{1-y}Se_y)_w$, where $0.6 \leq x \leq 0.9$. In certain such examples, the thermoelectric material can be p-type. In addition, y can be zero. As another example, the thermoelectric material can include a general composition of $(Bi_{1-x}Sb_x)_u(Te_{1-y}Se_y)_w$, where $0 < y \leq 0.1$. In some of these examples, the thermoelectric material can be n-type. In addition, x can be zero. As yet another example, the thermoelectric material can include a general composition of $(Bi_{1-x}Sb_x)_u(Te_{1-y}Se_y)_w$, where $0.1 \leq x \leq 0.5$. In some of these embodiments, the thermoelectric material can be n-type. In addition, y can be zero.

In certain embodiments, the thermoelectric material can include at least one group IV element and at least one group VI element where the group IV element can include at least one of lead and tin, and the group VI element can include at least one of sulfur, selenium, and tellurium. For example, the thermoelectric material can be a group IV-VI compound.

In some embodiments, the thermoelectric material includes a general composition of $(PbTe)_x(PbS)_y(SnTe)_z$, where $x+y+z=1$. In certain such embodiments, the thermoelectric material can be p-type. In some of these embodiments, the thermoelectric material includes a general composition of $(PbTe)_x(PbS)_y(SnTe)_z$, where (1) x, z, or y+z equals zero, (2) x, y, or x+y equals zero, or (3) x, z, or x+z equals zero. In other embodiments, the thermoelectric material can be n-type. In some of these embodiments, the thermoelectric material includes a general composition of $(PbTe)_x(PbS)_y(SnTe)_z$, where (1) y, z, or y+z equals zero, (2) x, y, or x+y equals zero, or (3) x, z, or x+z equals zero.

In certain embodiments, a method of making a thermoelectric material is provided. The method can include providing a powder comprising a thermoelectric composition, pressing the powder, and sintering the powder to form the thermoelectric material. In these embodiments, the thermoelectric material can include at least about 10 volume percent porosity. The method further can include mechanically alloying elemental powders to form the powder. In some embodiments, pressing the powder can form pressed pellets. As an example, pressing the powder can be done by cold compaction. In certain embodiments of the method, sintering the powder can include heating the powder to a first temperature for a first duration and heating the powder to a second temperature for a second duration. The powder can be heated to the first temperature before being heated to the second temperature. The first temperature can be less than the second temperature. The first temperature can be near the melting point of tin and the second temperature can be about 500° C. The first duration can be about 5 days and the second duration can be about 5 days. In some embodiments, sintering can be performed under vacuum.

BRIEF DESCRIPTION OF THE DRAWINGS

FIG. 1 shows a schematic of an example thermoelectric material with porosity in accordance with certain embodiments described herein.

FIG. 2A shows a schematic of electron propagation along surface states in accordance with certain embodiments described herein.

FIG. 2B shows a schematic of phonon propagation around a pore in accordance with certain embodiments described herein.

DETAILED DESCRIPTION

Figures 3A, 3B, 3C:
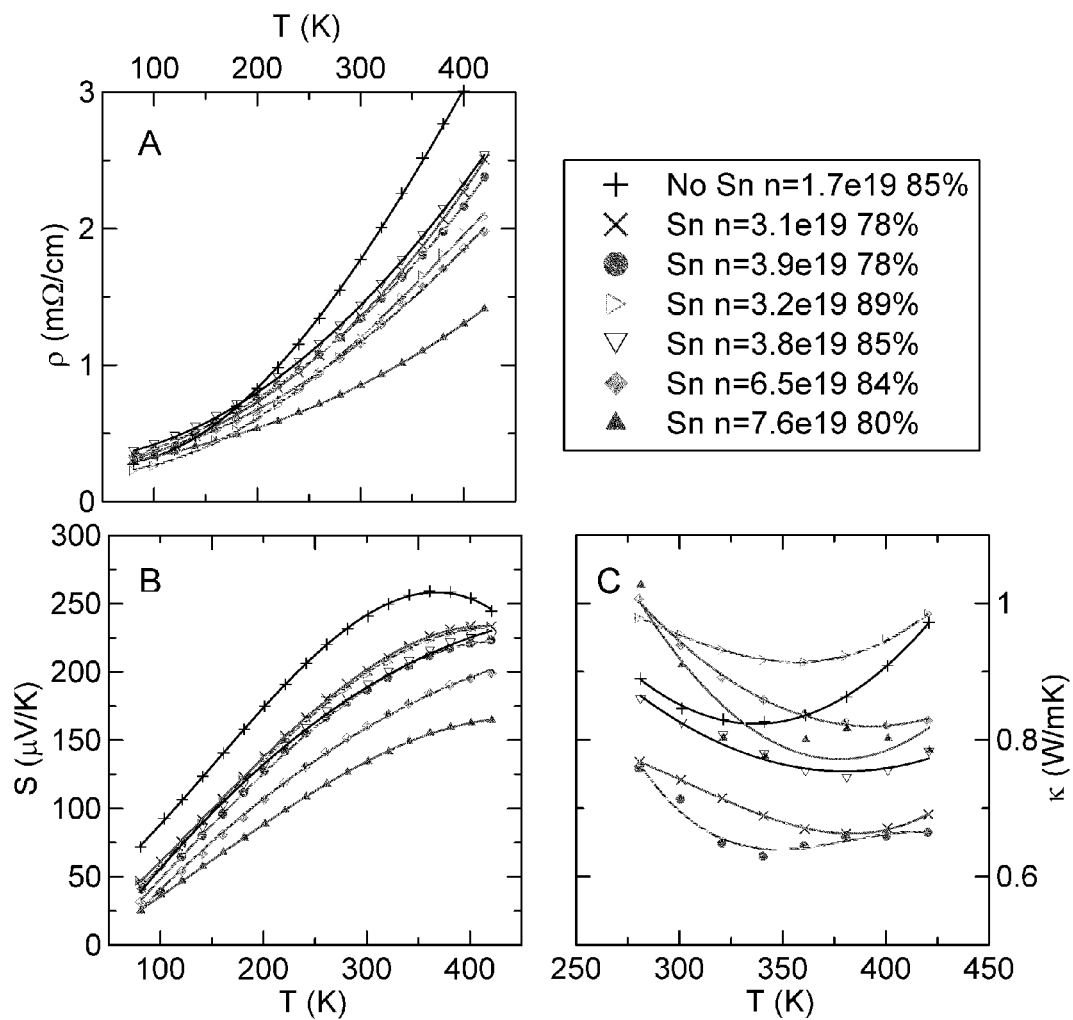
FIGS. 3A-3C include plots of the electrical resistivity $\rho$, the Seebeck coefficient S, and the thermal conductivity $\kappa$ as a function of temperature T, respectively, for p-type $Bi_{0.5}Sb_{1.5}Te_3$ samples with different carrier concentrations n and mass densities.

Described herein are certain embodiments of porous thermoelectric alloys and methods of preparing porous thermoelectric alloys. In certain embodiments, porosity in a thermoelectric alloy can improve the thermoelectric figure of merit zT by scattering phonons more than scattering electrons. For example, demonstrations made herein include p-type $Bi_{0.5}Sb_{1.5}Te_3$ and n-type $Bi_{1.9}Sb_{0.1}Te_{2.85}Se_{0.15}$ alloys commonly used in Peltier coolers operating near room temperature. Demonstrations made herein also include p-type PbTe doped with Tl, which is commonly used in thermoelectric generators operating at temperatures above room temperature. However, the techniques disclosed herein can be applied to other thermoelectric materials. For example, as described herein, any topological insulator can be used.

The basic effect described herein can generally be understood by the following equation for the thermoelectric figure of merit zT as:

$$zT \equiv \frac{S^2\sigma}{\kappa}T = (S^2n)\left(\frac{\mu}{\kappa}\right)qT, \quad (1)$$

where S is the thermopower, and $\sigma$ and $\kappa$ are the electrical conductivity and thermal conductivity, respectively. Furthermore, $\sigma=nq\mu$ can be decomposed into its components where q is the electron charge, n is the concentrations of electrons, and $\mu$ is the electron mobility. Holes are considered electrons with positive charges. Certain problems in optimizing thermoelectric materials can include metallurgical changes that (1) decrease $\kappa$ while also usually decreasing $\mu$, and those that (2) increase n while also usually decreasing S because the latter two can generally be related by the "Pisarenko relation" (Seebeck coefficient S as a function of carrier concentration n). By creating porous thermoelectric materials, certain embodiments of thermoelectric materials can be shown to increase the ratio of $\mu/\kappa$, and thus increase zT. This teaches against the accepted effective medium theory (see, e.g., D. Bergman and O. Levy, "Thermoelectric properties of a composite medium," *J. Appl. Phys.*, Vol. 70, No. 11, 6821-6833 (December 1991); and D. Bergman and L. Fel, "Enhancement of thermoelectric power factor in composite thermoelectrics," *J. Appl. Phys.*, Vol. 85, No. 12, 8205-8216 (June 1999)) as applied to thermoelectric composites, where one would consider one component as the thermoelectric alloy, and the other component as a void. From the effective medium theory, one would normally conclude that the ratio of $\mu/\kappa$ should be insensitive to porosity, and that the zT cannot be improved this way. Described herein is experimental evidence to the contrary.

In certain embodiments, the zT of thermoelectric materials in general can be improved by creating porous materials. FIG. 1 shows a schematic of an example thermoelectric material 100 with porosity or pores 120. The porosity or pores 120 can be open 121 (e.g., intersected by an outer surface of the material) or closed 122 (e.g., fully surrounded by the material). The thermoelectric material 100 can be any thermoelectric material known in the art or yet to be developed. For example, as described herein, the thermoelectric material 100 can include tetradymite semiconductors, Group IV-VI semiconductors, and/or any topological insulators. The porosity 120 can comprise a gas, e.g., air. The pores may contain any thermal and electrical insulator. For example, in certain embodiments, the pores may contain any thermal and electrical insulator that does not interact with the surfaces of the pores. In some embodiments, the use of more insulating insulators may be more advantageous.

In certain embodiments, the thermoelectric material 100 comprises at least about 10 volume percent porosity. For example, a thermoelectric material 100 can comprise about 10 to about 40 volume percent porosity or about 15 to about 25 volume percent porosity. In some embodiments, a thermoelectric material 100 includes at least about 15 volume percent porosity, at least about 20 volume percent porosity, at least about 25 volume percent porosity, at least about 30 volume percent porosity, or at least about 35 volume percent porosity. In other embodiments, a thermoelectric material 100 can include greater than about 40 volume percent porosity, e.g., at least about 45 volume percent porosity, or about 50 volume percent porosity. Porosity can be measured by dividing the mass of the material by the volume of the material. Any standard technique to measure porosity can be used.

As an example, a thermoelectric material 100 comprising at least about 10 volume percent porosity can include a thermoelectric material having a density (e.g., defined as 100% minus the percent porosity) of less than about 90 percent of the theoretical density for the thermoelectric material. As another example, a thermoelectric material 100 comprising at least about 10 to about 40 volume percent porosity can include a thermoelectric material having a density of about 60 to about 90 percent of theoretical density for the thermoelectric material. As yet another example, thermoelectric material 100 comprising at least about 15 to about 25 volume percent porosity can include a thermoelectric material having a density of about 75 to about 85 percent of thermoelectric density for the thermoelectric material. Thus, in some embodiments, the thermoelectric material 100 has a density range on order of 80±5% of the theoretical density of fully massive material.

In certain embodiments of porous materials, the zT of the thermoelectric material 100 is improved compared to the thermoelectric material without porosity. For example, in certain embodiments with porosity, the thermoelectric material 100 has a zT greater than about 1.2 at a temperature between about 250 K to about 400 K. For example the thermoelectric material 100 can have a zT greater than about 1.2 at a temperature of about 250 K, of about 275 K, of about 300 K, of about 325 K, of about 350 K, of about 375 K, or of about 400 K. As other examples, the thermoelectric material 100 with porosity can have a zT of or greater than about 1.3, of or greater than about 1.4, or of or greater than about 1.5 at a temperature between about 250 K to about 400 K (e.g., of about 250 K, of about 275 K, of about 300 K, of about 325 K, of about 350 K, of about 375 K, or of about 400 K).

In certain embodiments, the thermoelectric material 100 comprises a topological thermoelectric material as described herein. For example, as described herein, certain embodiments are based on topologically protected surface states (J. E. Moore, "The birth of topological insulators," *Nature*, Vol. 464, 194-198 (March 2010)), e.g., in tetradymite semiconductors. Certain topological insulators (TI) are TE materials around room temperature (e.g., around 300K).

As examples, topologically multiply-connected "Swiss-cheese"-like porous samples with micron-sized closed pores of three classes of materials are described herein. One example is the insulating material $Bi_2Te_2Se$ shown in FIGS. 12A-12D. A second example comprises doped p-type thermoelectric materials, and a third example comprises doped n-type thermoelectric materials. These three example classes show a strong reduction in phonon heat conduction without a similar reduction in electron mobility. This can lead to a 50% increase in zT of the p-type material (e.g., zT up to about 1.5), and a more modest about 30% increase for the n-type material. Evidence is presented in certain embodiments for the existence of electrically highly conducting channels along the surface of the pores. In certain embodiments, the pores decrease thermal conductivity because they act like empty voids to phonon conduction while limiting the electrical conductivity much less because the surface states channel electronic charge currents around them. FIGS. 2A-2B include schematics of electron and phonon propagation, respectively, through material 100 with pores 120 that act like voids for phonons, but where electrons can travel along surface states. For example, as shown in FIG. 2A, electrons flow along the surface of the pore 120 while as shown in FIG. 2B, phonons flow around the pore 120.

In certain embodiments, a substantial portion of the porosity 120 of the thermoelectric material 100 has a size that is between about 0.1 micron and about 1 micron (e.g., pore diameter). For example, the size or diameter of a pore 120 can be about 0.1 micron, about 0.2 micron, about 0.3 micron, about 0.4 micron, about 0.5 micron, about 0.6 micron, about 0.7 micron, about 0.8 micron, about 0.9 micron, or about 1 micron. As another example, a substantial portion of the porosity of the thermoelectric material 100 has a size that is between about 1 micron and about 10 microns (e.g., pore diameter). For example, the size or diameter of a pore 120 can be about 1 micron, about 2 microns, about 3 microns, about 4 microns, about 5 microns, about 6 microns, about 7 microns, about 8 microns, about 9 microns, or about 10 microns. As yet another example, a substantial portion of the porosity 120 of the thermoelectric material 100 has a size that is between about 50 nanometers and about 100 microns (e.g., pore diameter). For example, the size or diameter of a pore 120 can be about 0.05 micron, about 1 micron, about 10 microns, about 20 microns, about 30 microns, about 40 microns, about 50 microns, about 60 microns, about 70 microns, about 80 microns, about 90 microns, or about 100 microns. Furthermore, a substantial portion of the porosity 120 of the thermoelectric material 100 may have a size that is larger than at least one of the electron mean free path of the TE material and the phonon mean free path of the TE material. For example, the size of a pore 120 may be larger than both the electron's de Broglie wavelength and mean free path.

In certain topological thermoelectric materials, a substantial portion of the porosity 120 of the thermoelectric material 100 is substantially closed. For example, the surface states of the pores do not touch each other and thus do not provide a percolation path since their own Seebeck coefficient is not high (e.g., swiss-cheese geometry that is topologically as multiply-connected as possible). Additional examples of topological insulators (TI) may include tetradymite quaternary $BiSb_2$—$TeSe_3$ alloys (see, e.g., H. Zhang, C. X. Liu, X. L. Qi, X. Dai, Z. Fang, and S. C. Zhang, "Topological insulators in $Bi_2Se_3$, $Bi_2Te_3$ and $Sb_2Te_3$ with a single Dirac cone on the surface," *Nature Physics*, Vol. 5, 438-442 (June 2009)), $Bi_{(1-x)}Sb_{(x)}$ for at least 0<x<22%, HgCdTe, rare-earth substituted $CoSb_3$ and related skutterudites, and some Heuslers such as ScAuPb and ScPtBi (see, e.g., S. Chadov, X. Qi, J. Kübler, G. Fecher, C. Felser, and S. C. Zhang, "Tunable multifunctional topological insulators in ternary Heusler compounds," *Nature Materials*, Vol. 9, 541-545 (July 2010)).

As described herein, the thermoelectric material 100 can have a general composition of $(Bi_{1-x}Sb_x)_u(Te_{1-y}Se_y)_w$, where 0≤x≤1, 0≤y≤1, 1.8≤u≤2.2, 2.8≤w≤3.2. For example, porosity 120 may also be included in tetradymite semiconductors of a general alloy formula $(Bi_{1-x}Sb_x)_2(Te_{1-y}Se_y)_3$ with 0≤x, y≤1. Some of these embodiments can be based on topological protected surface states as described herein. In some embodiments, p-type material compositions can have 0.6<x<0.9 when y=0. In other embodiments, n-type material compositions can have 0<y<0.1 when x=0. In further embodiments, n-type material compositions may have 0.1<x<0.5 when y=0.

As also described herein, the thermoelectric material 100 can comprise at least one group IV element and at least one group VI element where the group IV comprises at least one of lead and tin, and the group VI comprises at least one of sulfur, selenium, and tellurium. Some of these embodiments can be based on surface states, but may not be based on topologically protected surface states. For example, porosity 120 may be included in doped p-type or n-type rock-salt or Group IV-VI compounds or semiconductors. For example, the thermoelectric material 100 can have a general alloy formula or composition of $(PbTe)_x(PbS)_y(SnTe)_z$ with x+y+z=1. In some embodiments, the thermoelectric material 100 is p-type. In such embodiments, x, z, or y+z equals zero; x, y, or x+y equals zero; or x, z, or x+z equals zero. In other embodiments, the thermoelectric material 100 is n-type. In these embodiments, y, z, or y+z equals zero; x, y, or x+y equals zero; or x, z, or x+z equals zero.

Without being bound by theory, for certain embodiments, it is considered that dopant concentration does not have a significant effect on the lattice component of thermal conductivity. Furthermore, the thermoelectric material 100 may have general compositions or comprise compounds such as those described in U.S. Patent Application Publication No. 2010/0258154 entitled "THERMOELECTRIC ALLOYS WITH IMPROVED THERMOELECTRIC POWER FACTOR," U.S. Patent Application Publication No. 2009/0235969 entitled "TERNARY THERMOELECTRIC MATERIALS AND METHODS OF FABRICATION," U.S. Patent Application Publication No. 2009/0178700 entitled "THERMOELECTRIC FIGURE OF MERIT ENHANCEMENT BY MODIFICATION OF THE ELECTRONIC DENSITY OF STATES," and U.S. Patent Application Publication No. 2011/0248209 entitled "THERMOELECTRIC FIGURE OF MERIT ENHANCEMENT BY MODIFICATION OF THE ELECTRONIC DENSITY OF STATES," the entirety of each of which is hereby incorporated by reference.

EXAMPLES

The following examples are provided to demonstrate the benefits of certain embodiments of the disclosed thermoelectric materials 100. These examples are discussed for illustrative purposes and should not be construed to limit the scope of the disclosed embodiments. For example, the embodiments should not be construed to be bound by any theories discussed below.

Bi—Te Samples

The sample alloys of certain embodiments described below were made from mechanically alloyed powders. Elemental Bi, Sb, Te, and Sn were placed in a steel vial with steel balls and were mechanically mixed to produce mechanically alloyed powder. The mechanically alloyed powers were then pressed using cold compaction to form pressed pellets. The pressed pellets of mechanically alloyed powders were sealed in quartz ampoules under vacuum after several outgassing steps. The ampoules were placed into a furnace just below the melting point of tin (e.g., below about 232° C.) and then at 500° C., both for 5 days to sinter the mechanically alloyed powder. This process yielded densities between about 78% and about 90% of the theoretical density of the alloy, depending on compaction pressure. For example, the compaction pressures ranged from about 200 MPa to about 1700 MPa with the higher densities obtained with a pressure at about 1700 MPa and densities between about 80% and about 90% of the theoretical density obtained with pressures between about 200 MPa and about 600 MPa.

P-Type $Bi_{0.5}Sb_{1.5}Te_3$+Sn

FIGS. 3A-3C include plots of the electrical resistivity ρ ($\rho = \sigma^{-1}$, where σ is electrical conductivity), the Seebeck coefficient S, and the thermal conductivity κ as a function of temperature T respectively for samples with different carrier concentrations n and mass densities as measured by percent of theoretical density. A correction was used to extract the concentration of charge carriers when using the Hall effect in effective media with the procedure by David Stroud. See D. Stroud and F. Pan, "Magnetoresistance and Hall coefficient of inhomogeneous metals," *Phys. Rev. B*, Vol. 20, No. 2, 455-465 (July 1979).

Figures 3D, 3E, 3F:
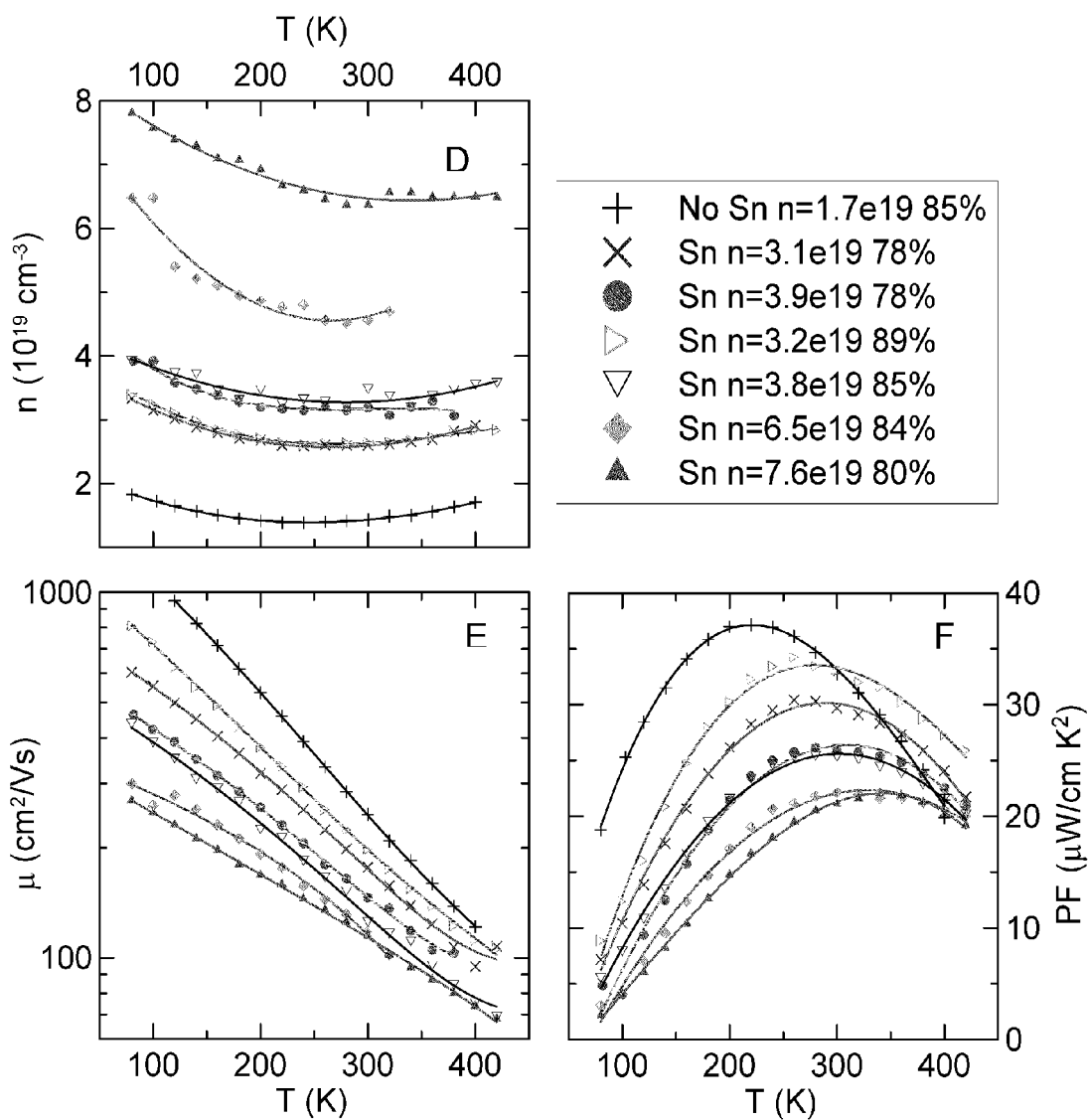
FIGS. 3D-3F include plots of the hole carrier concentration n, the electrical mobility $\mu$, and the power factor PF as a function of temperature T, respectively, for the same samples as FIGS. 3A-3C.

FIGS. 3D-3F include plots of the hole carrier concentration n, the electrical mobility μ, and the power factor PF, which is equal to $S^2\sigma$, as a function of temperature T respectively for the same samples as FIGS. 3A-3C.

Figures 3G, 3H, 3I:
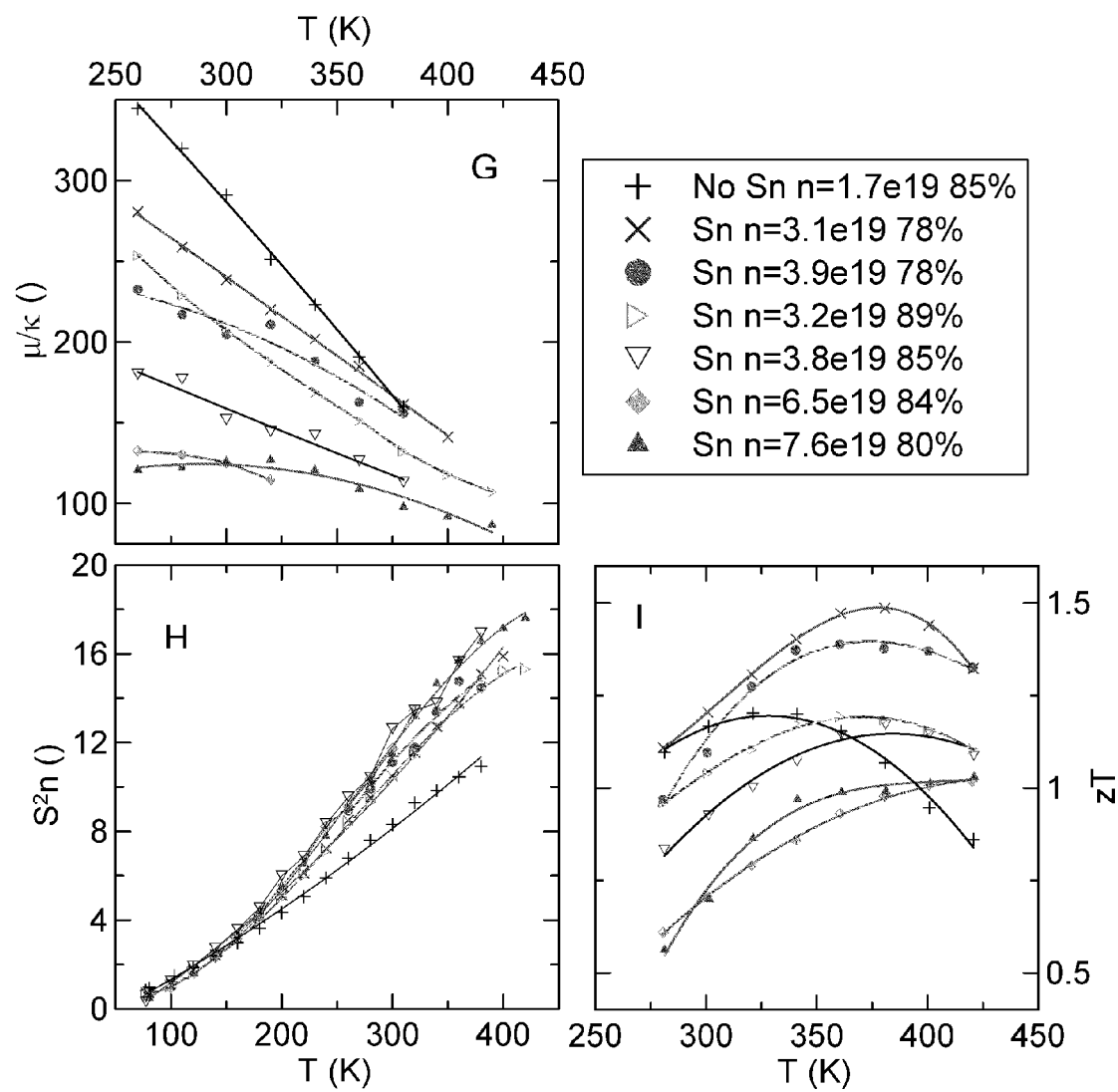
FIGS. 3G-3I include plots of $\mu/\kappa$, $S^2n$, and zT as a function of temperature T, respectively, for the same samples as FIGS. 3A-3F.

FIGS. 3G-3I include plots of μ/κ, $S^2n$, and zT as a function of T for the same samples as FIGS. 3A-3F. FIGS. 3G and 3H illustrate that, without being bound by theory, porosity can increase the ratio of μ/κ while substantially maintaining $S^2n$. Also as shown in FIG. 3H, $S^2n$ was higher for Sn-doped samples than the sample not doped with tin, which without being bound by theory, supports that Sn is a resonant impurity that increases the power factor $S^2u$ and thus increases zT as shown in FIG. 3I.

Figure 4:
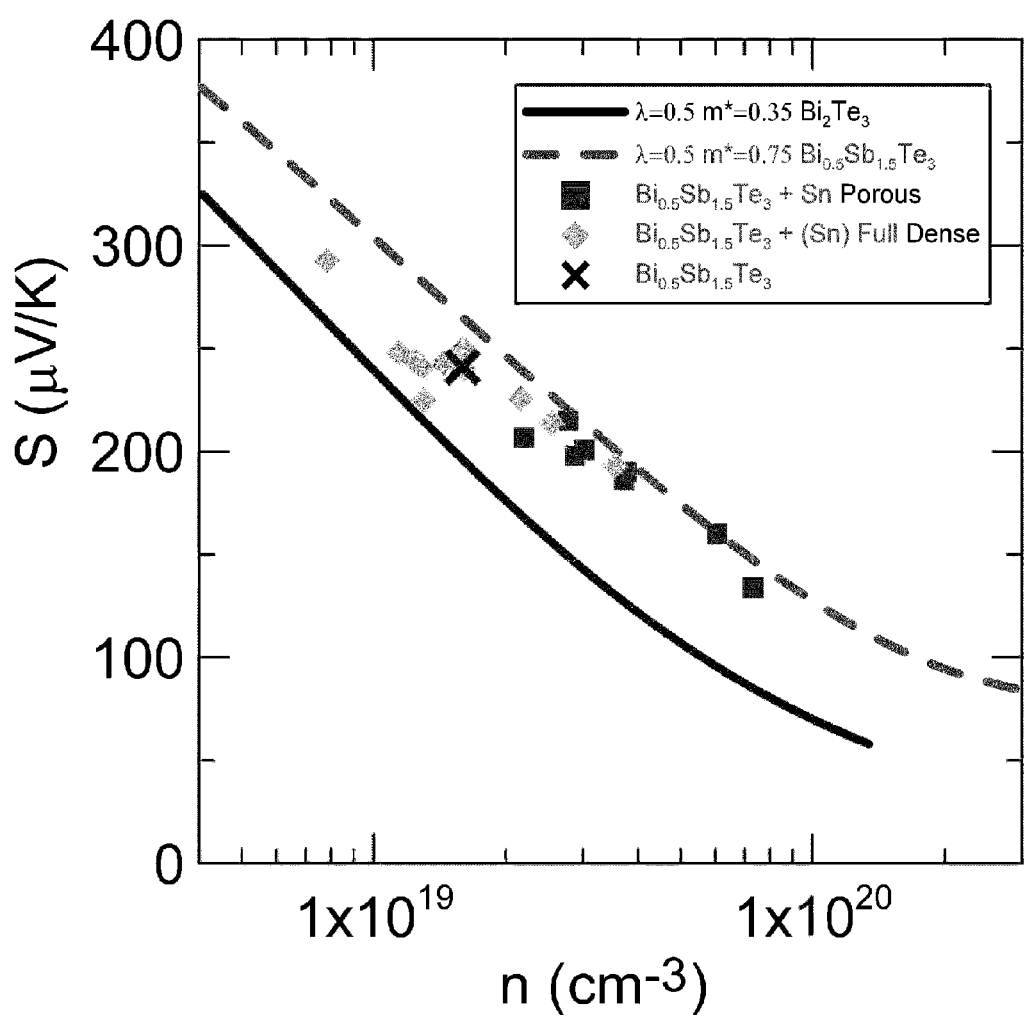
FIG. 4 is a plot of the Pisarenko relation for ternary BiSbTe alloys.

FIG. 4 is a plot of the Pisarenko relation at 300 K for $Bi_{0.5}Sb_{1.5}Te_3$. It shows the room-temperature relationship between thermopower S and carrier concentration n ("Pisarenko" relation) for variously-prepared porous and non-porous polycrystalline $Bi_{0.5}Sb_{1.5}Te_3$ samples. The data points are the data collected on various samples, doped with different Sn concentrations (including some with no Sn) and unintentionally by defect chemistry. The lines were calculated assuming a mix of acoustic phonon and ionized impurity scattering and two values for the effective mass, 0.35 (binary $Bi_2Te_3$) and 0.75 (~$Bi_{0.5}Sb_{1.5}Te_3$) times the free electron mass. This relationship can be calculated (see, e.g., C. Jaworski, V. Kulbachinskii, and J. Heremans, "Resonant level formed by tin in $Bi_2Te_3$ and the enhancement of room-temperature thermoelectric power," *Phys. Rev. B.*, Vol. 80, 233201-1-233201-4 (2009) and U.S. Patent Application Publication No. 2010/0258154 to Heremans et al.) from the effective mass of the band, the Fermi energy deduced from the carrier concentration, and knowledge of the scattering mechanism. The calculations assumed that the electron relaxation time is given by a power law of energy, $\tau=\tau_0 E^\lambda$, where the exponent $\lambda$ was taken to be $-\frac{1}{2}$ for a mix of acoustic and ionized impurity phonon scattering. S is known to be a resonant level in binary $Bi_2Te_3$, leading to a strong departure of the thermopower above the Pisarenko value calculated given knowledge of the bands (J. P. Heremans, C. M. Thrush and D. T. Morelli, "Thermopower enhancement in PbTe with Pb precipitates," *J. Appl. Phys.*, Vol. 98, 063703-1-063703-6 (2005)). If the enhancement is attributed to a distortion of the density of states (DOS), a local value of the effective mass can be attributed to the resonant level, by calculating what mass would produce the enhanced S. From FIG. 4, the maximum value for the DOS mass would be slightly below 0.75 free electron masses. While such would be an enhanced mass for binary $Bi_2Te_3$, it was not enhanced for the $Bi_{0.5}Sb_{1.5}Te_3$ composition where two valence bands at different k-points of the Brillouin zone become degenerate and a total DOS mass >0.75 was observed (M. Stordeur, H. T. Langhammer, H. Sobotta, and V. Riede, "Valence band structure of $(Bi_{1-x}Sb_x)_2Te_3$ single crystals," *Phys. Stat. Sol.* (b), Vol. 104, 513-522 (1981)). Sn is thus not a resonant level in this example, and was not responsible for the high zT. As shown in FIG. 4, the sample with porosity behaves electrically as if it were fully dense.

N-Type $Bi_{1.9}Sb_{0.1}Te_{2.85}Se_{0.15}$

Thermoelectric materials and methods described herein can also be applied to lowering lattice thermal conductivity of certain embodiments of n-type thermoelectric alloys. In a sample of an undoped n-type composition of $Bi_{1.9}Sb_{0.1}Te_{2.85}Se_{0.15}$ in accordance with certain embodiments described herein, specific heat capacity Cp was measured at 300 K to be about 0.158 J/g. Mass density was measured to be about 6.26 g/cm$^3$, and thermal diffusivity was measured to be about 0.7 mm$^2$/s. From these measurements, the thermal conductivity $\kappa$ due to lattice conduction was found to be about 0.7 W/mK at 300 K. The value for the bulk thermal conductivity of an alloy of the same composition is about 1.1 W/mK. Therefore, the effect of introducing porosity in this n-type alloy composition was similar to the effect seen in the p-type alloys described above. Thus, in certain embodiments, pores can lower the thermal conductivity, both in n-type and the p-type alloys described above.

P-Type PbTe

Figures 5A, 5B, 5C, 5D:
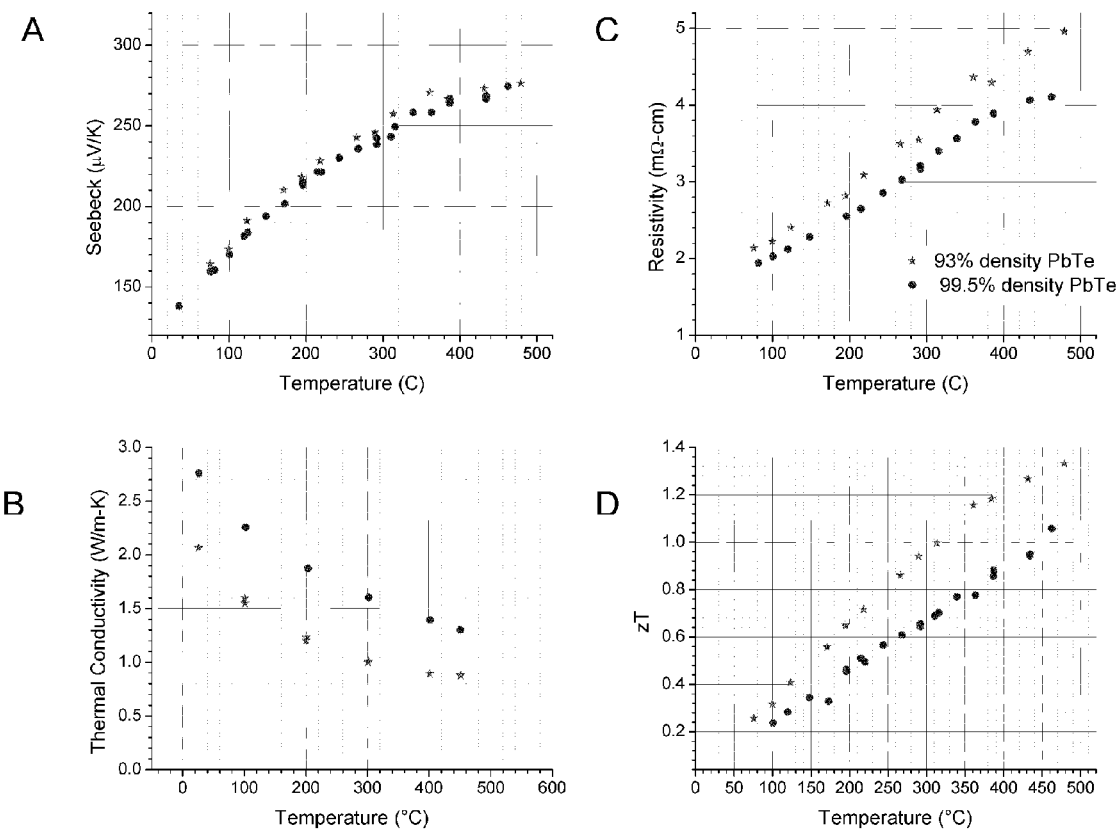
FIGS. 5A-5D include plots of the Seebeck coefficient S, the thermal conductivity $\kappa$, the electrical resistivity $\rho$, and zT as a function of temperature T, respectively, for PbTe samples with carrier concentrations $n=7\times10^{19}$ $cm^{-3}$ and mass densities of about 99.5% and about 93% of theoretical density.
Figure 6A:
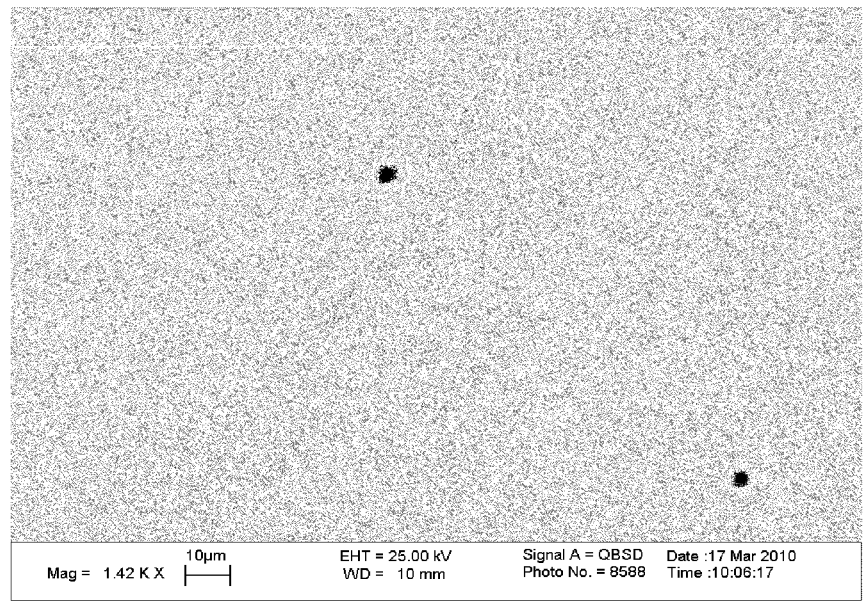
FIGS. 6A-6B include micrographs of PbTe alloys with mass densities of about 99.5% of theoretical density and about 93% of theoretical density, respectively.
Figure 6B:
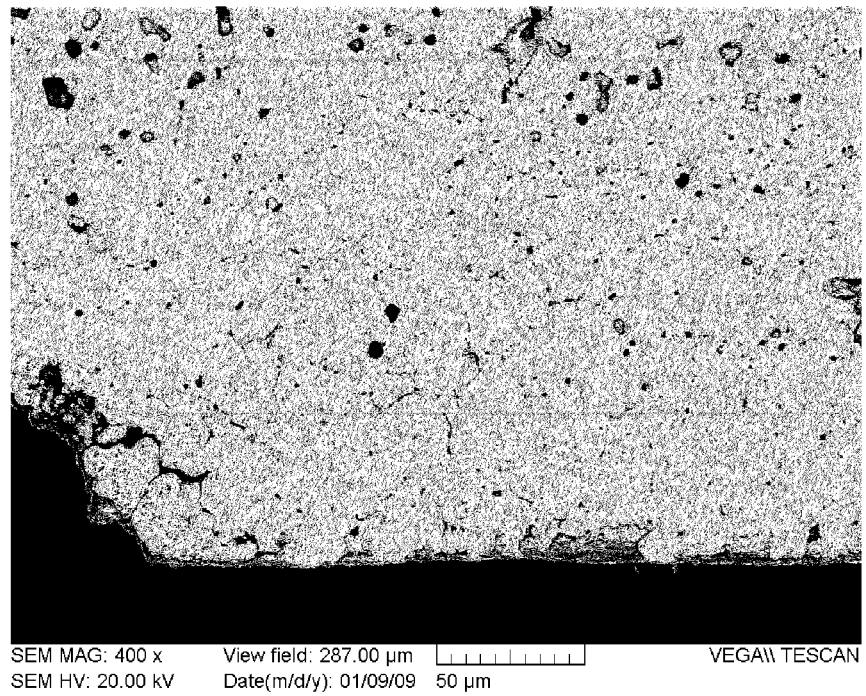
Figure 7A:
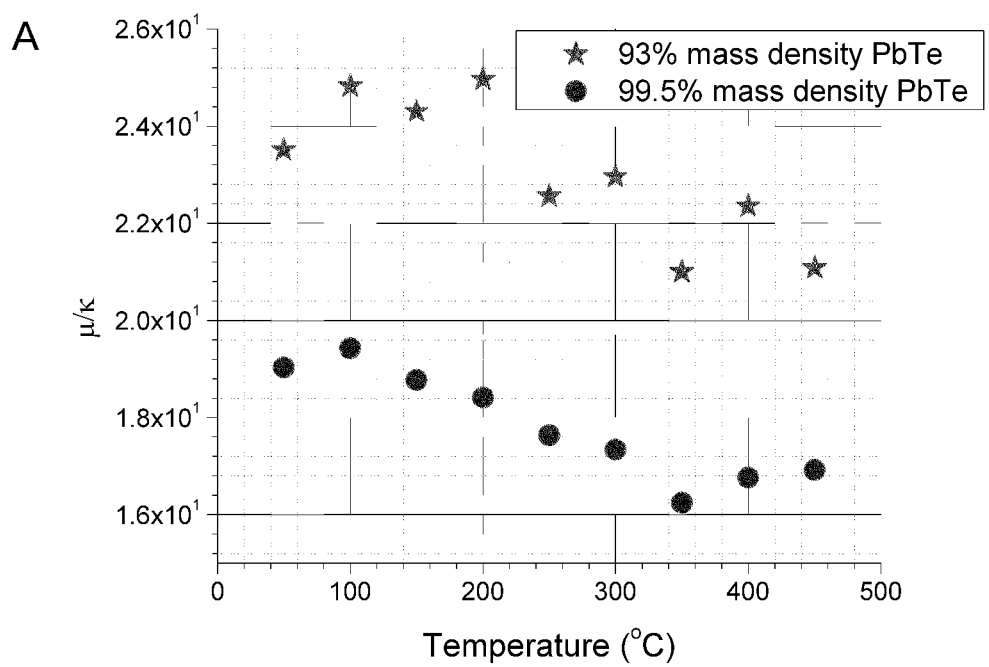
FIG. 7A shows a plot of $\mu/\kappa$ as a function of temperature T for the same samples as FIGS. 5A-5D.
Figure 7B:
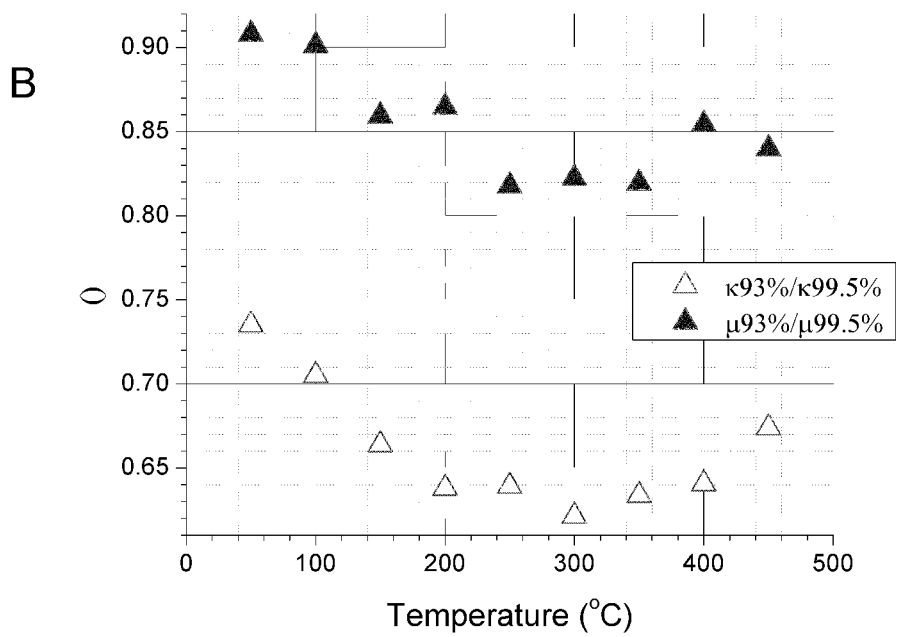
FIG. 7B shows a plot of the ratios of hole mobilities $\mu$ and thermal conductivities $\kappa$ as a function of temperature T for the same samples as FIGS. 5A-5D.

The below alloy samples in accordance with certain embodiments, were prepared by hot pressing. This method yielded densities between about 90% and about 99.5%, depending on compaction pressure. For example, pressures up to 60 MPa were used. Materials were made by pressing and simultaneously heating pellets of fine powders. Powders were prepared by grinding alloys of p-type PbTe doped with about 2 at % Tl. FIGS. 5A-5D include plots of the Seebeck coefficient S, the thermal conductivity $\kappa$, the electrical resistivity $\rho$ ($\rho=\sigma^{-1}$, where $\sigma$ is electrical conductivity), and zT as a function of temperature T respectively for PbTe samples with carrier concentrations $n=7\times10^{19}$ cm$^{-3}$ and mass densities of about 99.5% and about 93% of theoretical density. FIGS. 6A-6B are micrographs of samples with 99.5% and 93% theoretical densities respectively. FIG. 7A shows a plot of the ratio $\mu/\kappa$ as a function of T for the same samples as in FIGS. 5A-5D. FIG. 7B shows a plot of the ratios of hole mobilities $\mu$ and thermal conductivities $\kappa$ as a function of temperature T for the two PbTe samples of FIGS. 5A-5D with similar carrier density ($\sim 7\times10^{19}$ cm$^{-3}$) and different mass densities. FIG. 7B shows that when the mass density decreases from 99.5% to 93%, the electrical mobility decreases about 10 to about 15% while the thermal conductivity K decreases up to about 45%.

In certain embodiments, thermoelectric materials and methods described above show significant decrease in thermal conductivity which is not proportional to reduction in mobility. Described p-type PbTe material has significantly increased zT reaching about 1.3, as shown in FIG. 5D. Since improvement in these embodiments is not related to electronic structure of material, certain embodiments described herein can be extended to n-type PbTe. Certain embodiments described herein can also be extended to other doped semiconducting materials in the group IV-VI family, where group IV elements include Pb and Sn and group VI elements include S, Se and Te.

Topologically Protected Surface States

Because certain TE materials described herein contain heavy atoms, many thermoelectric semiconductors, such as $Bi_{1-x}Sb_x$ and tetradymite $(Bi_{1-x}Sb_x)_2(Te_{1-y}Se_y)_3$ alloys, can have topologically protected surface states for certain x and y ranges. Heavy atoms can reduce the lattice thermal conductivity by lowering both the specific heat and the sound velocity. For example, in certain embodiments, they can lead to strong spin-orbit interactions that result in a Dirac-like dispersion relation for the charge carriers. When the number of pockets in the Fermi surface is odd, this can lead to topologically protected surface states. Experimental evidence for the existence of the latter can be provided by angularly-resolved photoemission spectroscopy (ARPES) and tunneling spectroscopy. (J. Checkelsky, Y. Hor, M. H. Liu, D. X. Qu, R. Cava, and N. Ong, "Quantum Interference in Macroscopic Crystals of Nonmetallic $Bi_2Se_3$," *PRL*, Vol. 103, 246601-1-246601-4 (December 2009); J. Checkelsky, Y. Hor, R. Cava, and N. Ong, "Bulk Band Gap and Surface State Conduction Observed in Voltage-Tuned Crystals of the Topological Insulator $Bi_2Se_3$," *PRL*, Vol. 106, 196801-1-196801-4 (May 2011); and Dong-Xia Qu, Y. S. Hor, Jun Xiong, R. J. Cava, and N. P. Ong, "Quantum Oscillations and Hall Anomaly of Surface States in the Topological Insulator $Bi_2Te_3$," *Science*, Vol. 329, 821-824 (August 2010)). Topological insulator (TI) surface states may also be observed in SdH oscillations (Z. Ren, A. A. Taskin, S. Sasaki, K. Segawa, and Y. Ando, "Large bulk resistivity and surface quantum oscillations in the topological insulator $Bi_2Te_2Se$," *Phys. Rev. B.*, Vol. 82, 241306-1-241306-4, (2010)). Measurements of transport in these papers may not be considered credible.

The description below contrasts electron transport and phonon transport through a topologically multiply-connected Swiss-cheese geometry (e.g., substantially closed porosity) that evidences the contribution of surface states to conduction, and that surface states can increase the thermoelectric figure of merit zT in certain embodiments. The figure of merit zT is a function of the thermopower S, and the electrical and thermal conductivities ($\sigma=ne\mu$; $\kappa=\kappa_e+\kappa_\phi$):

$$zT \equiv \frac{S^2\sigma}{\kappa}T = S(n)^2\left[\frac{\mu}{\kappa}\right]eT, \quad (2)$$

where n is the charge carrier concentration, μ its mobility, e is the carrier charge, and $\kappa_e$ and $\kappa_\phi$ represent the electron and phonon contribution to heat conduction. In TE semiconductors, in general $\kappa_e<\kappa_\phi$. Here, the zT of porous thermoelectric materials of certain embodiments is increased by about 50%, giving a peak zT of about 1.5 in optimally doped p-type material that has a bulk zT of about 1 because macroscopic closed pores (e.g., pores with diameter greater than about one micron) decrease $\kappa_\phi$ without affecting $\sigma$ as much. This is in contrast with some previous reports on how porosity reduces zT. See, e.g., Y. Yokotani, K. Kugimiya and H. Ando, "Thermoelectric semiconductor having a porous structure deaerated in a vacuum and thermoelectric panel using p-type and n-type thermoelectric semiconductors" U.S. Pat. Reissued Re. 35,441, 1997; and H. Lee, D. Vashaee, D. Wang, M. Dresselhaus, Z. Ren, and G. Chen, "Effects of nanoscale porosity on thermoelectric properties of SiGe," *J. Appl. Phys.*, Vol. 107, 094308-1-094308-7 (2010). In addition, in certain embodiments where the pores are micron-sized dimensions (e.g., greater than about 50 nm), the effect is different from that of nano-structuring, which is known to increase zT (B. Poudel et al., "High-Thermoelectric Performance of Nanostructured Bismuth Antimony Telluride Bulk Alloys," *Science*, Vol. 320, 634-638 (May 2008)) by playing off the difference between phonon and electron mean free paths that are on the order of 10-100 nm.

In certain embodiments, the concept of surface states improving zT can be illustrated in FIGS. 2A and 2B, and can be based on the difference between macroscopic electron and phonon flow around the pores. Heat Q carried by phonons can flow around the pores. If there are surface states in the material surrounding the pores, they can concentrate the flow of electrical current I along the pores edges, while Q can concentrate in the bulk host material. To phonons, the pores look like voids; to electrons, they look like another electrical conductor. In certain embodiments, the pores are larger and in some examples, much larger than the de Broglie wavelength of the electrons in the surface states because topologically protected surface states may be destroyed in some embodiments if electron wave functions interfere across the void. For example, in certain embodiments, the pores can be larger than the electron mean free path of the TE material and the phonon mean free paths of the TE material.

Figures 8A, 8B:
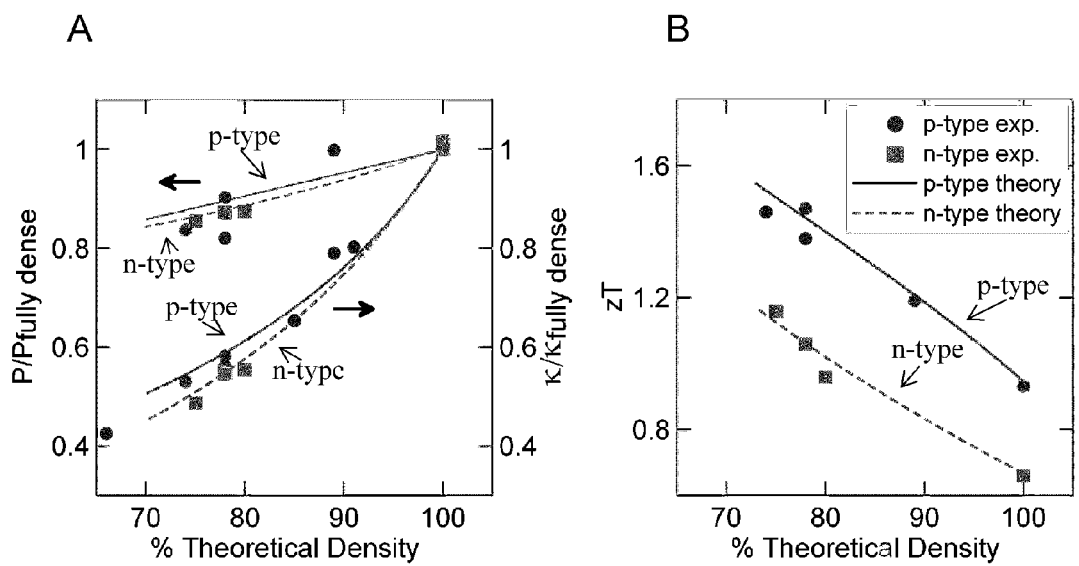
FIG. 8A shows a plot of the relative changes in power factor P and thermal conductivity $\kappa$ for p-type and n-type materials as a function of the percentage of theoretical density.
FIG. 8B shows a plot of the thermoelectric figure of merit zT for p-type and n-type materials as a function of the percentage of theoretical density.

FIG. 8A shows a plot of the relative changes in power factor P and thermal conductivity $\kappa$ for p-type and n-type materials as a function of the percentage of theoretical density. FIG. 8B shows a plot of the thermoelectric figure of merit zT for p-type and n-type materials as a function of the percentage of theoretical density. Lines are calculated using the effective medium theory and the model shown in FIGS. 2A and 2B. The symbols are data points at 360 K for both p-type and n-type materials. As shown in FIGS. 8A and 8B, the experimental data is consistent with the calculated values and that zT can increase with porosity (e.g., or decrease in the percentage of theoretical density). FIGS. 8A-8B will be discussed further below.

Experimental evidence for the existence of the surface states can be shown by comparing the electrical and thermal transport in sets of bulk samples with varying porosity based on three classes of tetradymite alloys. In (1) a series of undoped samples of certain embodiments, where the surface states carry a larger fraction of the current, metallic behavior is observed at low temperature that disappears in the presence of a magnetic field which opens a 9±3 μeV gap. In (2) n-type and (3) p-type doped tetradymite alloy samples of certain embodiments, electron transport decreases less with porosity than phonon transport. Here sample-to-sample comparisons may be complicated by the fact that defect chemistry can dominate the charge carrier concentration: it is challenging to prepare different samples with exactly the same Fermi level, n, S and $\sigma$. That is circumvented here as follows. When $\kappa_E<\kappa_\phi$, electronic effects concentrate in the numerator of equation (2). The numerator of zT is the power factor P=$S^2\sigma$, an all-electronic property. Similarly to how the power of a photovoltaic device is given by the area under its current/voltage curve, the P of a thermoelectric material measures the amount of power that can be produced per unit volume and temperature gradient since S$\sigma\Delta$T gives the voltage and $\sigma$ is proportional to the current that can be drawn under that voltage with the TE short-circuited. It is also the numerator of zT. Because S generally decreases with n, while $\sigma$ generally increases, in certain embodiments, there is an optimal value of doping level and n that maximizes P, and high-zT samples can be doped near that level. Because then dP/dn=0, P rather than $\sigma$ is used here to describe the electron transport while minimizing the spurious noise in the experiment due to variations in n. In tetradymites near the optimum doping level, P is n- insensitive within the sample reproducibility range, also resulting in robust manufacturing processes for these industrial alloys.

The three classes of samples, and the range of carrier concentrations of the host materials calculated from the Hall data (D. Stroud, "Hall coefficient of effective medium," *Phys. Rev. B*, Vol. 13, 1434-1438 (1976)) are:

(1) Undoped and slightly iodine-doped $Bi_2Te_2Se_{0.99}$ in which the compensation of the defect chemistry of $Bi_2Te_3$ and $Bi_2Se_3$ leads to very low defect-induced n, as close as is known today to a topological insulator material (J. Xiong, A. Petersen, D. Qu, R. Cava, and N. Ong, "Quantum oscillations in a topological insulator $Bi_2Te_2Se$ with large bulk resistivity (6 Ωcm)," arXiv:1101.1315v1 (January 2011); and Z. Ren, A. A. Taskin, S. Sasaki, K. Segawa, and Y. Ando, "Large bulk resistivity and surface quantum oscillations in the topological insulator $Bi_2Te_2Se$," *Phys. Rev. B.*, Vol. 82, 241306-1-241306-4 (2010)).

(2) Optimized p-type $Bi_{0.5}Sb_{1.5}Te_3$ doped with Sn, with n of about $3.7\pm0.5\times10^{19}$ cm$^{-3}$. The most porous samples have a peak zT of about 1.5 near 350K (see, e.g., FIGS. 10A-10F).

(3) Optimized n-type $Bi_{1.9}Sb_{0.1}Te_{2.85}Se_{0.15}$ doped with iodine to n of about $2.2\pm0.5\times10^{19}$ cm$^{-3}$ (see, e.g., FIG. 11A-11F).

Figures 9A, 9B, 9C, 9D:
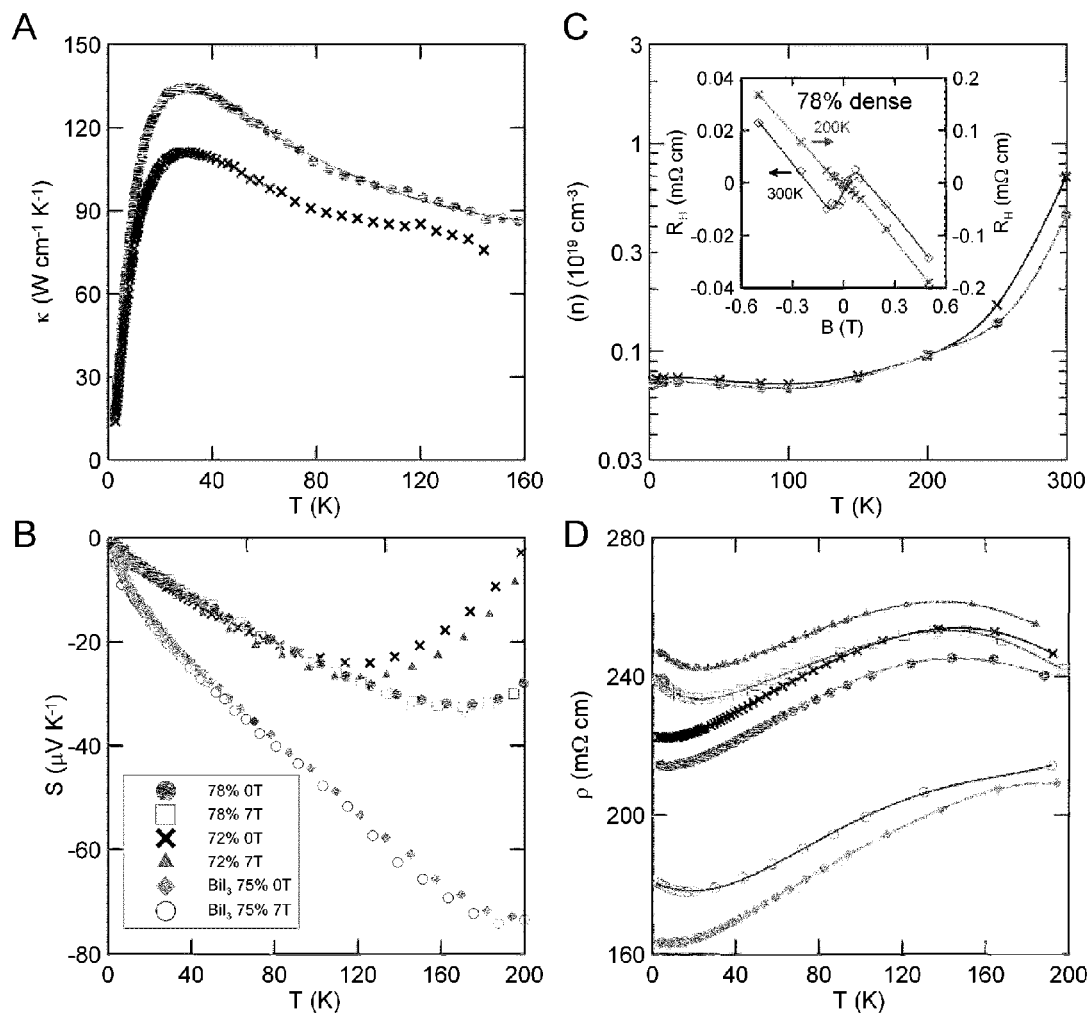
FIG. 9A shows a plot of the thermal conductivity $\kappa$ as a function of temperature T of $Bi_2Te_2Se_{0.99}$ with varying densities.
FIG. 9B shows a plot of the Seebeck coefficient S as a function of temperature T of $Bi_2Te_2Se_{0.99}$ with varying densities.
FIG. 9C shows a plot of the electron concentration n as a function of temperature T of $Bi_2Te_2Se_{0.99}$ with varying densities.
FIG. 9D shows a plot of the electrical resistivity p as a function of temperature T of $Bi_2Te_2Se_{0.99}$ with varying densities.

FIGS. 9A-9D include plots of thermoelectric properties of nearly-intrinsic $Bi_2Te_2Se_{0.99}$ with varying densities. For example, FIG. 9A shows the thermal conductivity $\kappa$; FIG. 9B shows the Seebeck coefficient S; FIG. 9C shows the electron concentration n; and FIG. 9D shows the electrical resistivity $\rho$, all as a function of temperature T for samples with varying densities. The inset in FIG. 9C shows the Hall resistance vs. magnetic field B for a 78% dense sample. In FIGS. 9A-9D, another sample is n-type doped slightly with iodine substituted on the anion site.

As discussed above, the electrical resistivity ($\rho=\sigma^{-1}$, where $\sigma$ is electrical conductivity) and n of $Bi_2Te_2Se_{1-\delta}$ samples of different porosity are shown in FIGS. 9C and 9D. The undoped samples show electron freeze-out from 150-300 K that follows an activated behavior with $E_{aHT}$ at about 98 meV. Further, the low field positive slope in the Hall coefficient gives n of about $6.9 \times 10^{18}$ cm$^{-3}$ holes. I-doped samples have a similar 30-150 K behavior with $E_{aHT}$=77 meV, $E_g$ is about 150 meV, but n decreases down to 2K, where n is about $3 \times 10^{17}$ cm$^{-3}$ yet $\rho$ is lower than in the undoped samples. The low-temperature resistivity $\rho(B=0)$ is metal-like at 0 T. In a magnetic field, $\rho(B=7T)$ is activated again below 20 K with $E_{aLT}$=9±3 µeV.

The transport properties of three single-crystals of the same material are shown and will be discussed with respect to FIGS. 12A-12D: they can be either n-type or p-type, with S(T<200K) either +400 µV K$^{-1}$ or −300 µV K$^{-1}$. In strong contrast, the thermopower of the porous samples at T<200K is much smaller, follows a T$^1$ law, and has no magnetic field dependence at T<100 to 150 K, suggesting that it is dominated by a metallic state that does not exist in single crystals. At T>200 K in zero field, and in-field at 100K for the 72% dense and 170K for the 78% dense samples, S turns positive and tends toward that of the single crystal.

As shown in the inset of FIG. 9C, the magnetic field B dependence of the transverse Hall resistivity shows that two carriers appear at 300K, one n-type and one p-type, but only the holes exist at 200K (n is derived from the negative slope). This is consistent with the S(T) measured on the single crystals, where thermally activated 2-carrier transport also appears in the bulk. The thermal conductivity $\kappa$ is dominated by phonons, and decreases with porosity.

One explanation consistent with these observations is that conduction through the porous samples is dominated by the bulk material when T>200K, but surface states start contributing below. The surface states are metallic at B=0. At B=7T, a gap of $E_{a2}$~9±3 µeV opens as expected for topological insulators, as shown in FIG. 9D. Consistently, the small metallic n-type thermopower of the surface states dominates at T<200K and 0T, but the overall S tends to join that of the bulk host material at higher temperature. This happens at a lower T in 7T, consistently with a gap opening.

Figures 10A, 10B, 10C, 10D, 10E, 10F:
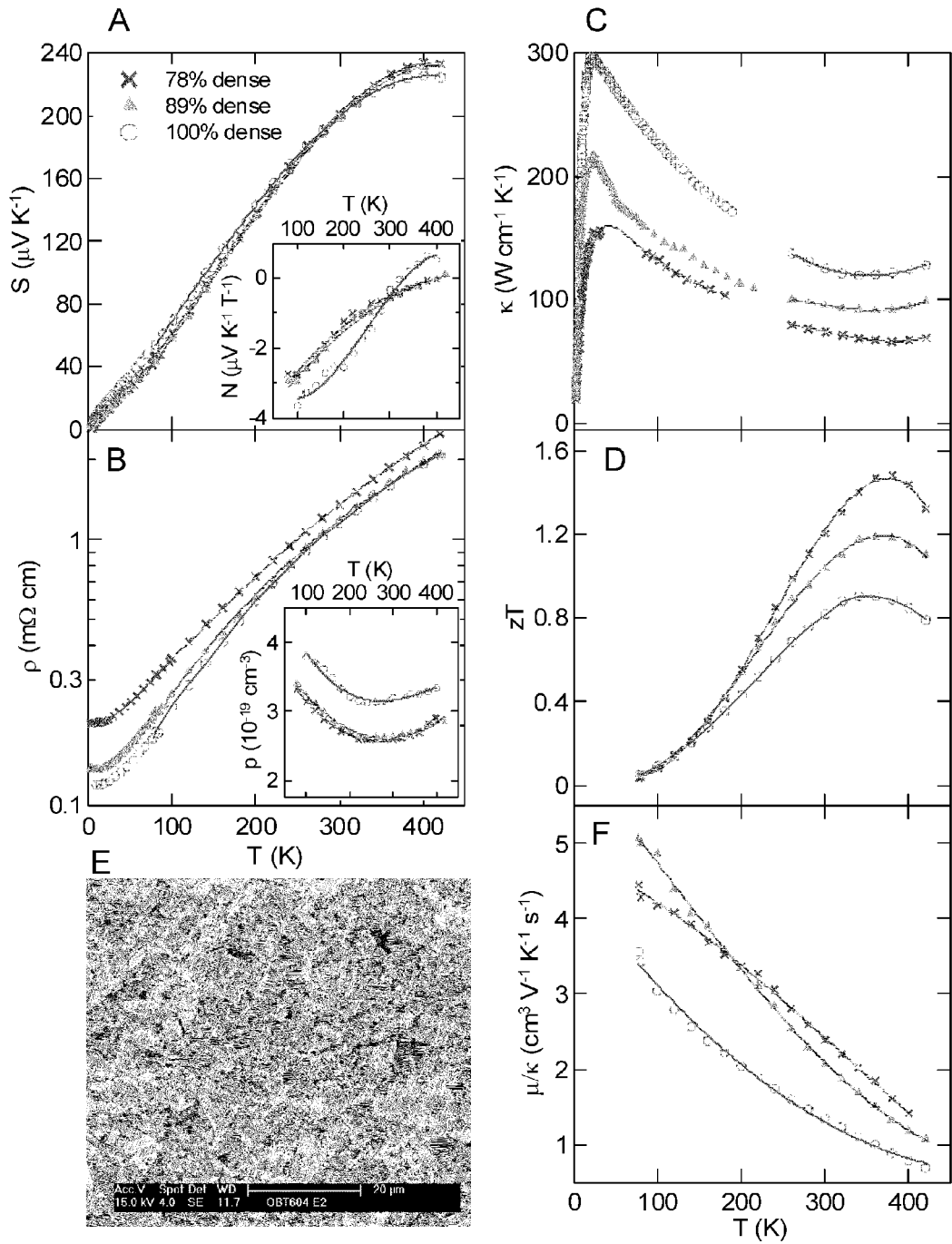
FIG. 10A shows the Seebeck coefficient S with the Nernst-Ettingshausen coefficient N in the inset as a function of temperature T for p-type $Bi_{0.5}Sb_{1.5}Te_3$ with varying mass densities.
FIG. 10B shows the electrical resistivity $\rho$ with carrier density p in the inset as a function of temperature T for p-type $Bi_{0.5}Sb_{1.5}Te_3$ with varying mass densities.
FIG. 10C shows the thermal conductivity x as a function of temperature T for p-type $Bi_{0.5}Sb_{1.5}Te_3$ with varying mass densities.
FIG. 10D shows the figure of merit zT as a function of temperature T for p-type $Bi_{0.5}Sb_{1.5}Te_3$ with varying mass densities.
FIG. 10E shows an SEM image of 78% dense p-type $Bi_{0.5}Sb_{1.5}Te_3$.
FIG. 10F shows the ratio of electrical mobility $\mu$ to thermal conductivity $\kappa$ as a function of temperature T for p-type $Bi_{0.5}Sb_{1.5}Te_3$ with varying mass densities.

FIGS. 10A-11D and 10F include plots of thermoelectric properties of p-type $Bi_{0.5}Sb_{1.5}Te_3$ with varying mass densities. For example, FIG. 10A shows the Seebeck coefficient S with the Nernst-Ettingshausen coefficient N as inset; FIG. 10B shows the electrical resistivity $\rho$ with carrier density p as inset; FIG. 10C shows the thermal conductivity $\kappa$; FIG. 10D shows the figure of merit zT; and FIG. 10F shows the ratio of electrical mobility $\mu$ to thermal conductivity $\kappa$, all as a function of temperature T for samples with varying density. FIG. 10E shows an SEM image of 78% dense p-type $Bi_{0.5}Sb_{1.5}Te_3$.

As shown in FIG. 10D, the p-type material shows a strong increase in zT with increased porosity, to a maximum zT of about 1.5 for these samples compared to 0.9 for fully dense material of the same composition. The reproducibility of this result on several different batches of nominally identical composition is further described below. As shown in FIG. 10B, the samples of different porosity were selected to have n as similar as possible. As shown in FIG. 10A, the Nernst-Ettingshausen coefficient, which is characteristic of the scattering mechanism (J. Heremans, C. Thrush and D. Morelli, "Thermopower enhancement in PbTe with Pb precipitates," J. Appl. Phys., Vol. 98, 063703-1-063703-6 (2005)), is also nearly invariant, and thus so is S for these samples. Importantly, for these samples, FIG. 10C shows a very strong decrease of $\kappa$ with increasing porosity, and a much smaller increase in $\sigma$. This is illustrated in FIG. 10F which is a plot of the temperature-dependence of the ratio $\mu/\kappa$, thereby minimizing the influence of n. The increase in $\mu/\kappa$ increases zT per equation (2). No increase is observed from the Pisarenko relation (e.g., as shown in FIG. 4 discussed above): Sn here is not resonant level as in binary $Bi_2Te_3$. See C. Jaworski, V. Kulbachinskii, and J. Heremans, "Resonant level formed by tin in $Bi_2Te_3$ and the enhancement of room-temperature thermoelectric power," Phys. Rev. B., Vol. 80, 233201-1-233201-4 (2009). Through optimal doping, the temperature of peak zT can be changed to 300K (e.g., as will be discussed with respect to FIG. 13D where zT is about 1.4), a flexibility that is attractive for many applications.

Figures 11A, 11B, 11C, 11D, 11E, 11F:
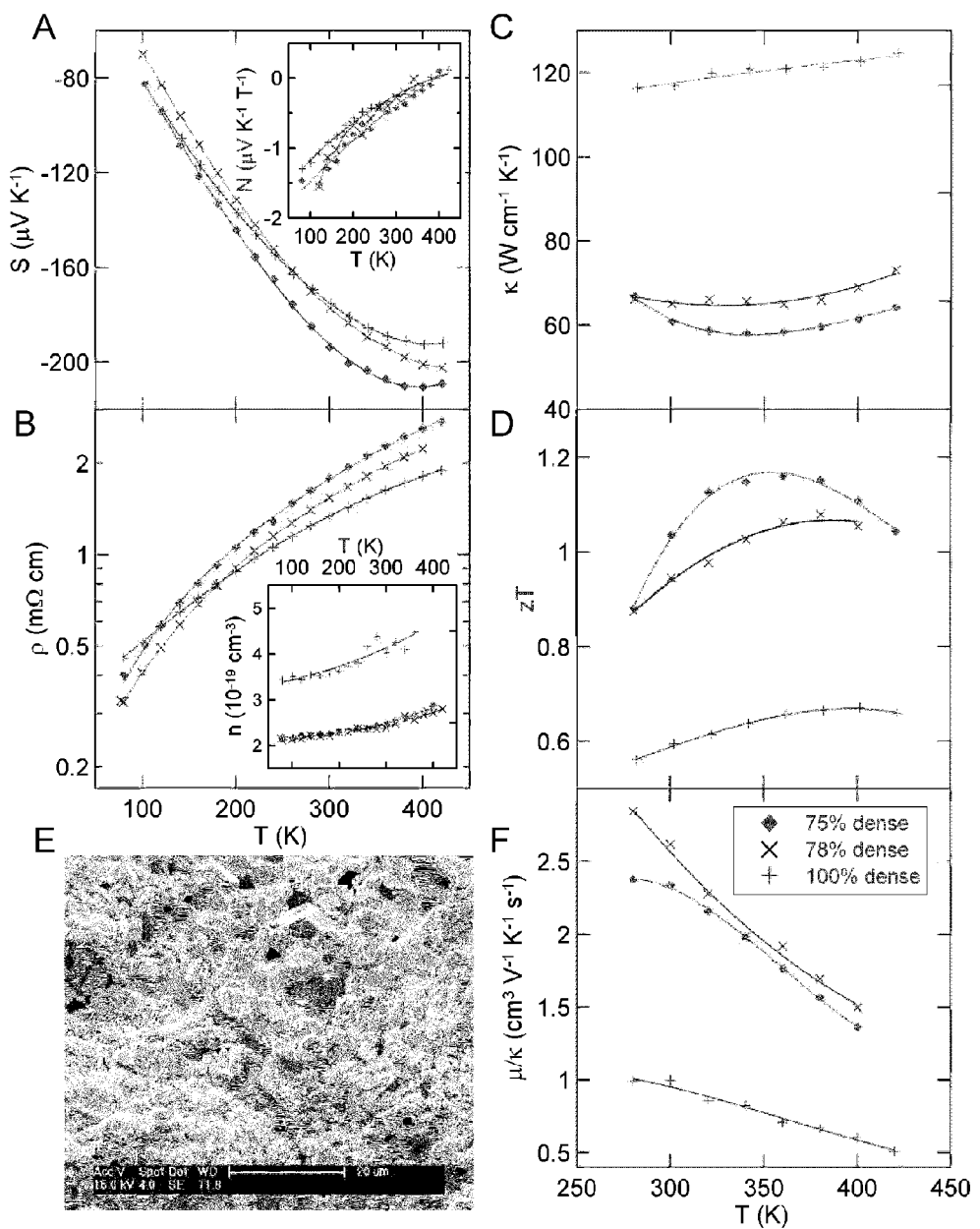
FIG. 11A shows the Seebeck coefficient S with the Nernst-Ettingshausen coefficient N in the inset as a function of temperature T for samples of n-type $Bi_{0.5}Sb_{1.5}Te_3$ with varying mass densities.
FIG. 11B shows the electrical resistivity $\rho$ with the carrier density n in the inset as a function of temperature T for samples of n-type $Bi_{0.5}Sb_{1.5}Te_3$ with varying mass densities.
FIG. 11C shows the thermal conductivity $\kappa$ as a function of temperature T for samples of n-type $Bi_{0.5}Sb_{1.5}Te_3$ with varying mass densities.
FIG. 11D shows the figure of merit zT as a function of temperature T for samples of n-type $Bi_{0.5}Sb_{1.5}Te_3$ with varying mass densities.
FIG. 11E shows an SEM image of 79% dense material.
FIG. 11F shows the ratio of electrical mobility $\mu$ to thermal conductivity $\kappa$ as a function of temperature T for samples of n-type $Bi_{0.5}Sb_{1.5}Te_3$ with varying mass densities.
Figures 12A, 12B, 12C, 12D:
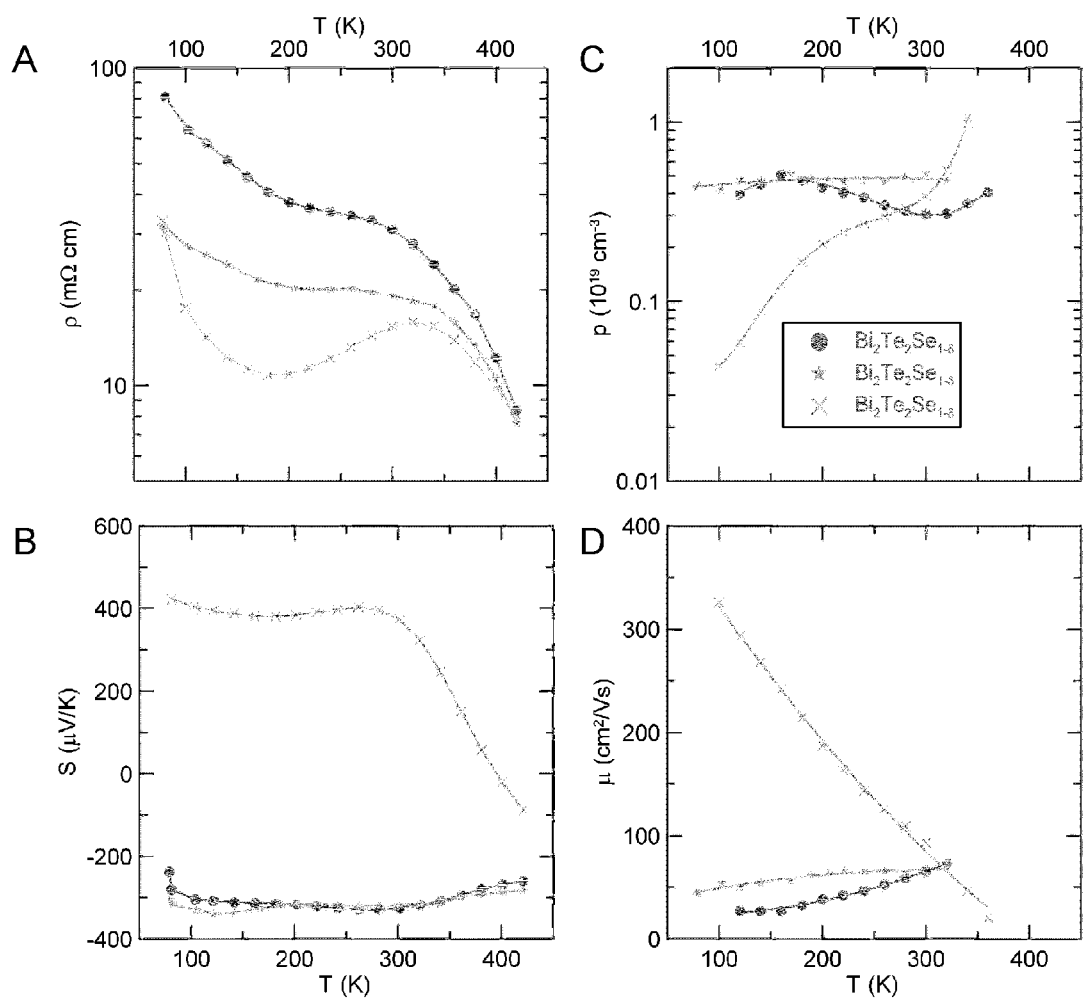
FIGS. 12A-12D include plots of thermoelectric properties: electrical resistivity $\rho$, Seebeck coefficient S, carrier concentration p, and electrical mobility $\mu$, respectively, from three different Bridgeman single crystals of $Bi_2Te_2Se_{1-\delta}$ as functions of temperature T.

FIGS. 11A-11D and 11F include plots of thermoelectric properties of n-type $Bi_{0.5}Sb_{1.5}Te_3$ with varying mass densities. For example, FIG. 11A shows the Seebeck coefficient S with the Nernst-Ettingshausen coefficient N as inset; FIG. 11B shows the electrical resistivity $\rho$ with carrier density n as inset; FIG. 11C shows the thermal conductivity $\kappa$; FIG. 11D shows the figure of merit zT; and FIG. 11F shows the ratio of electrical mobility $\mu$ to thermal conductivity $\kappa$, all as a function of temperature T for samples with varying densities. FIG. 11E shows an SEM image of 79% dense material.

Compared with the example p-type materials shown in FIGS. 10A-10F, similar relative improvements can be observed in the example n-type materials as shown in FIGS. 11A-11F. The 75% dense sample provided a maximum zT of about 1.18, compared to less than 0.7 for a 100% dense sample and slightly over 1 in a 78% dense sample that displays a different T− dependence of S and $\kappa$.

The interpretation of FIGS. 10A-10F and 11A-11F is based on the effective medium theory for thermoelectrics (D. Bergman and L. Fel, "Enhancement of thermoelectric power factor in composite thermoelectrics," J. Appl. Phys, Vol. 85, No. 12, 8205-8216 (June 1999); and D. Bergman and O. Levy, "Thermoelectric properties of a composite medium," J. Appl. Phys, Vol. 70, No. 11, 6821-6833 (December 1991)) which calculates the effective values of $S_E$, $\kappa_E$, $\sigma_E$, $P_E = S_E^2 \sigma_E$ and $zT_E$ of a composite constructed of two thermoelectric materials A and B and a volume fraction $\Phi$ of inclusions of material B in host A in the Swiss-cheese topology. Independent and invariant values for $S_A$, $\kappa_A$ and $\sigma_A$ and $S_B$, $\kappa_B$ and $\sigma_B$ for A and B, and $\Phi$ are input; the presence of B is assumed not to affect the properties of A, which here implies that B particles do not scatter electrons or phonons in A whose flows remain diffusive. In conventional thermoelectrics, the theory proves that the composite $zT_E$ cannot exceed that of either component (J. Heremans and C. Jaworski, "Experimental study of the thermoelectric power enhancement in composites," Appl. Phys. Lett., Vol. 93, 122107-1-122107-3 (2008)); while certain theories described herein can explain an increase in $zT_E$ with $\Phi$ if voids behave like shown in FIGS. 2A-2B, with A the host tetradymite and B the voids for phonons and pores surrounded by surface states for electrons.

Results for the density-dependence of the thermoelectric properties of both p-type and n-type porous materials at 360 K, and fits to the model are shown in FIGS. 8A-8B, where the relative decreases in power factor P and in total thermal conductivity $\kappa$ as a function of porosity expressed as percentage of theoretical density is shown. $S_A$, $\kappa_A$ and $\sigma_A$ were taken from the 100% dense sample of each series. FIG. 8B shows that n-type and p-type materials can behave similarly. A similarly formulated bulk commercial alloy was used as reference for $\kappa$. The pores are assumed to have $\sigma_B = (\frac{1}{2})\sigma_A$, $S_B = S_A$, and $\kappa_B = 0$. An electronic contribution to $\kappa$ from the surface states is calculated using $\sigma_E$ and the Wiedeman-Franz law with a Lorenz ratio of 1/3 the free electron value. For certain embodiments, adding surface states explains the behavior of the porous materials rather well for the observed increase in zT (see, e.g., FIG. 8B) in systems where the size of the pores is macroscopic with respect to electron wave functions and scattering lengths. The model also suggests that the zT will continue to increase with increasing porosity, e.g. with the amount of internal surface area. Ultimately, for certain embodiments, the mechanical strength of the porous material will become unacceptable, or a percolation path will form.

In summary, for certain embodiments, surface states can contribute to electrical transport in multiply-connected bulk Swiss-cheese-like samples, e.g., in tetradymite $(Bi_{1-x}Sb_x)_2(Te_{1-y}Se_y)_3$ alloys, while phonon transport is impeded by the pores.

Because the surface states are expected to be robust in certain embodiments, the porous samples were prepared by ball-milling followed by cold-pressing and subsequent sintering. The sintering conditions, which can strongly influence the final carrier concentrations, were held constant within one composition series. The pressure determined the porosity. Fully dense reference samples were obtained by spark plasma sintering from the same powder. Sample density was determined using the Archimedes method, and by weighing and measuring geometrical volume; the percentage of theoretical density was calculated by comparing that measured to the calculated theoretical one. Both methods gave similar results to within about 2%. From this, it can be concluded that the pores were substantially closed, which was consistent with the scanning electron micrographs. The κ was measured with the heat flux parallel to the pressing direction using flash diffusivity at room temperature and above and the static heater and sink method below room temperature. The S and N were measured using the static heater and sink method and σ and Hall voltage were measured with an AC 4-wire method, with heat flux and current also along the pressing direction.

Sample Preparation Methods

Elemental Bi, Sb, Te, Se, and SnTe or $BiI_3$ (99.999% pure, ~10 g total) were loaded under argon into stainless steel vials and mechanically alloyed for 65 minutes in a SPEX 8000M. The p-type materials of FIGS. 10A-10F are $Bi_{0.5}Sb_{1.5}Te_3+(SnTe)_{0.0025}$; n-type of FIGS. 11A-11F are $Bi_{1.901}Sb_{0.1}Te_{2.85}Se_{0.15}(BiI_3)_{0.001}$; and the intrinsic materials of FIGS. 9A-9D are $Bi_{2.001}Te_2Se_{0.99}$ with some doped with $(BiI_3)_{0.00083}$. The powders (~5 g per pellet) were densified under Ar at 300K at pressures between 0.23-1.7 GPa, then reampouled under vacuum. The p-type samples were sintered for 5 days at 220° C., then 5 days at 500° C., while the n-type and intrinsic samples were sintered for 5 days at 500° C.

Measurements

Parallelepipeds were cut for static heater-and-sink galvanomagnetic and thermomagnetic measurements oriented so the electrical current and heat flow are parallel to the pressing direction. The parallelepipeds were tested in a $LN_2$ flow cryostat (−78 K≤T≤420 K, −1.5 T≤B≤1.5T) and in a Quantum Design Physical Properties Measurement System (PPMS, 1.8 K≤T≤3000 K, −7 T≤B≤7T) equipped with the Thermal Transport Option (TTO) for S, ρ, and κ, with the AC Transport option (ACT) for Hall measurements ($R_H$) and the Heat Capacity Option to measure the isobaric specific heat. In both cryostats, S, κ and N were measured in a static heater and sink configuration and ρ and $R_H$ in a 4-wire configuration with an AC bridge. The TTO used cernox thermometry and manganin voltage wires. It derived the data using a two-tau fitting routine built into the instrumentation software; here data was taken at 0.25-0.5 $K^{-1}$ sweep rate. Samples in the $LN_2$ cryostat were equipped with 25 μm diameter type-T thermocouples and Cu voltage wires attached to the samples with Ag-epoxy. When tested, the data from both instruments overlapped.

Thermal diffusivity (α) measurements at T≥294K were made in an Anter Corp. Flashline 3000. The samples were disk shaped, cut from the piece of sample adjacent to the parallelepipeds above, and so that the heat flux was also along the direction of pressing, parallel to what it was for the static measurements described above, in order to avoid any effect on zT of a potential anisotropy. The thermal conductivity at T≥300K was calculated from the diffusivity using $κ=ρ_d C_p α$ and the 300K values of $C_p$ and $ρ_d$. The values for κ at T<200 K were taken exclusively and without corrections from the static methods, but at 260 and 280 K these values were corrected for radiative losses which were estimated by fitting a tangent between the two sets of data. Eventual errors in this procedure affected the results in a temperature region that was not crucial to the conclusions described herein.

The two main sources of experimental errors in the absolute values reported herein were the measurement of $C_p$ and of the exact sample geometry where the error depended on the ratio between the diameter of the wires used and the sample size. Noise in voltages and temperatures contributed negligibly, and they were the only contributors to the relative temperature dependences of the properties. In the $LN_2$ cryostat with 25 μm diameter wires, S had an accuracy of about 3%, ρ of about 7%, and N & $R_H$ of about 10%. Error in S and κ as measured in the TTO was estimated at about 10% due to increased size of thermometry. Similarly, the absolute value of $C_p$ had a ≥5% error in absolute value at 300 K, where it reached the Dulong-Petit value. Because the T-dependence was ignored above that, the error may have increased by a few %. The overall error on zT from these sources was thus 14% in the range of FIGS. 10 and 11. Mass density ($ρ_d$) used to calculate the percent of theoretical density ($ρ_d$/calculated $ρ_d$ for fully dense material from composition and crystal lattice) reported was measured by comparing the geometrical volume of the sample with its weight (the geometrical method). The difference between this method and the Archimedes method was on the order of about 2%, suggesting that the pores were closed and that this was the measurement error.

The Stroud theory that was used was derived for voids in a homogenous conductor. A theory that can simultaneously address both the voids and the surface states in a solid is not yet known. The correction factor in Hall coefficient is ¾ times porosity (D. Stroud F. P. Pan, "Effect of isolated inhomogeneties on the galvanomagnetic properties of solids," *Phys Rev B*, Vol. 13, 1434 (1976)).

Properties of Undoped Single-Crystals of $Bi_2Te_2Se_{1-δ}$.

$Bi_2Te_2Se_{1-δ}$ single crystals were grown for reference by a vertical Bridgeman method with a pull rate of 1.25 $mm^{-1}$. The single crystals were cleaved along the growth direction, perpendicularly to the trigonal axis. The transport properties of three single-crystals of the same nominal composition are shown in FIGS. 12A-12D. The properties were measured along the trigonal plane, with the magnetic field applied along the trigonal axis. The fact that the defect density varied along the length of the sample was taken advantage of, which was probably due to different densities of the melt constituents. S was measured along the length of the sample. At the point where the sign of S inverted (from positive to negative), samples were cut on either side. One sample was p-type, two others n-type; the latter two samples showed no freeze-out in carrier concentration, although the p-type sample did with $p=4×10^{17}$ $cm^{-3}$ at 100 K. This sample displayed 2-carrier conduction in both ρ and S, and a much better mobility than the n-type samples. Importantly, the low-temperature S of all samples, +400 μV $K^{-1}$ and −300 μV $K^{-1}$, was much larger than for the porous samples (FIG. 9B).

Properties of p-Type Material

Figures 13A, 13B, 13C, 13D, 13E, 13F:
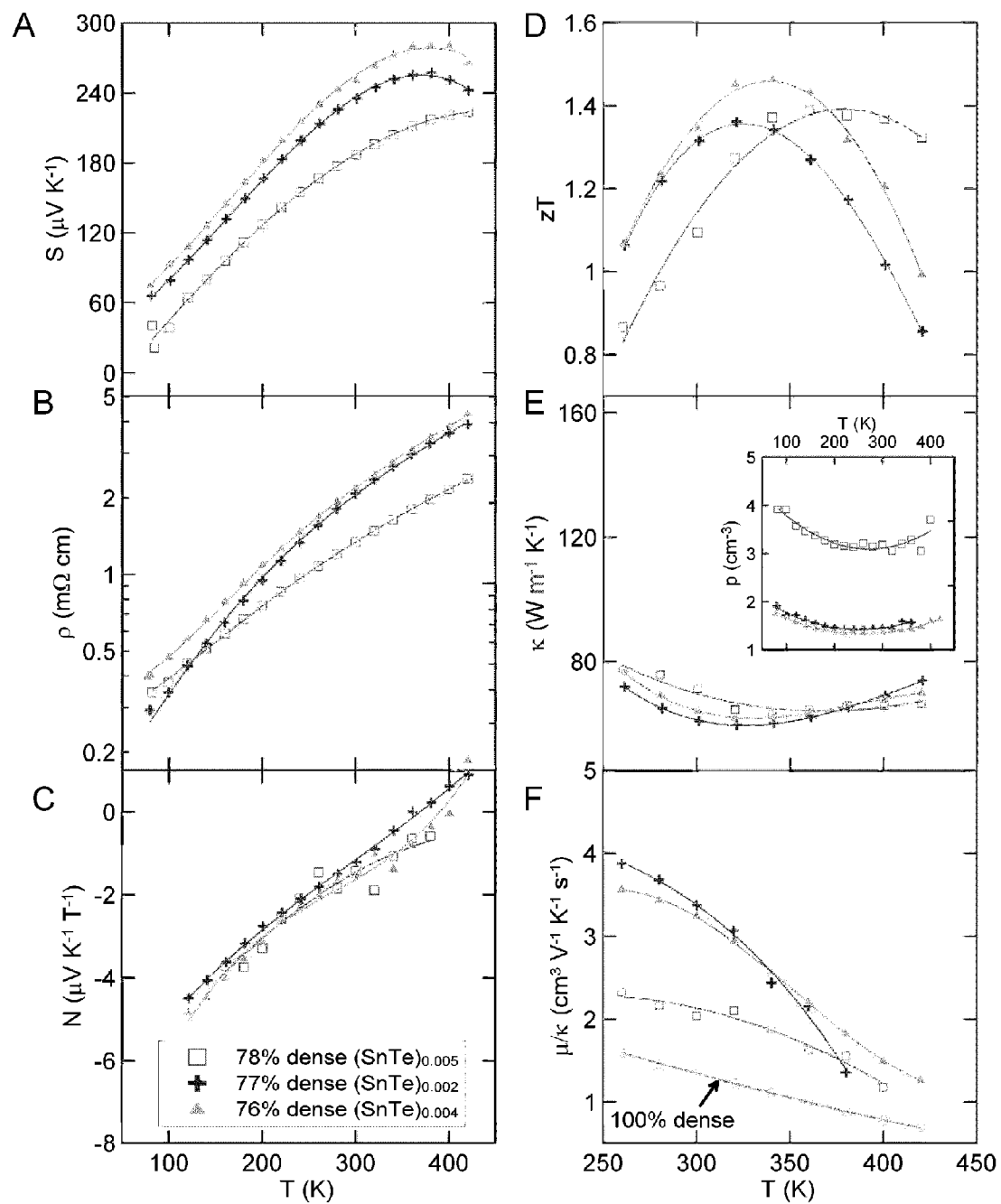
FIGS. 13A-13F include plots of thermoelectric properties Seebeck coefficient S, electrical resistivity $\rho$, Nernst-Ettingshausen coefficient N, figure of merit zT, thermal conductivity $\kappa$ with carrier concentration p in the inset, and ratio of electrical mobility to thermal conductivity $\mu/\kappa$, respectively, of several samples of porous p-type $Bi_{0.5}Sb_{1.5}Te_3$ as functions of temperature T.

Reproducibility of zT being often an issue in thermoelectrics research, FIGS. 13A-13F show data on the transport properties of three more samples prepared as independent batches with different Sn levels following a similar recipe as for the data shown in FIGS. 10A-10D and 10F. For example, FIGS. 13A-13F include plots of thermoelectric properties of several samples of porous p-type $Bi_{0.5}Sb_{1.5}Te_3$ as functions of temperature T. FIG. 13A shows the Seebeck coefficient S; FIG. 13B shows the electrical resistivity ρ; FIG. 13C shows the Nernst-Ettingshausen coefficient N; FIG. 13D shows the figure of merit zT; FIG. 13E shows the thermal conductivity κ with the carrier concentration p in the inset; and FIG. 13F shows the ratio of electrical mobility to thermal conductivity μ/κ; all as a function of temperature T for p-type $Bi_{0.5}Sb_{1.5}Te_3$ samples with varying mass densities. An optimum zT of about 1.4 was repeatedly achieved in 76-79% dense samples with different preparation runs. The main source of variability was the doping level, as is illustrated in the thermopower S. This led also to changes in the temperature at which the zT was maximum and slightly decreasing, as certain TE materials have as an intrinsic property due to their band gaps a temperature where they will reach a peak zT.

Example Methods of Making and Using a Thermoelectric Material

Figure 14:
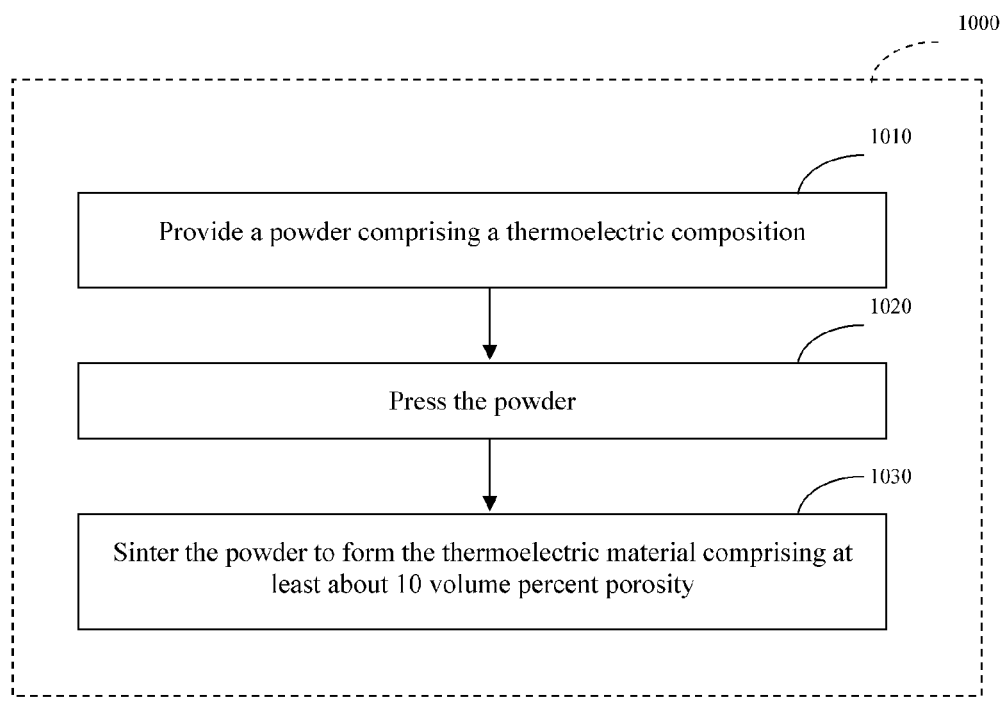
FIG. 14 is a flowchart of an example method of making a thermoelectric material in accordance with certain embodiments described herein.

FIG. 14 is a flowchart of an example method 1000 of making a thermoelectric material in accordance with certain embodiments described herein. The method comprises providing a powder comprising a thermoelectric composition, as shown in operation block 1010 of FIG. 14. The method 1000 also comprises pressing the powder, as shown in operational block 1020; and sintering the powder to form the thermoelectric material, as shown in operational block 1030.

The method 1000 can result in a thermoelectric material 100 as described herein. For example, in certain embodiments, the thermoelectric material 100 comprises at least about 10 volume percent porosity. In other embodiments, the thermoelectric material 100 includes at least about 15 volume percent porosity, at least about 20 volume percent porosity, at least about 25 volume percent porosity, at least about 30 volume percent porosity, at least about 35 volume percent porosity, or at least about 40 volume percent porosity. In other embodiments, the thermoelectric material 100 can include greater than about 40 volume percent porosity, e.g., at least about 45 volume percent porosity, or at least about 50 volume percent porosity.

In addition, the thermoelectric material 100 with porosity can have a zT greater than about 1.2 at a temperature between about 250 K to about 400 K, e.g., at about 375 K. As other examples, the thermoelectric material 100 with porosity can have a zT of or greater than about 1.3 at a temperature between about 250 K to about 400 K, e.g., at about 375 K, of or greater than about 1.4 at a temperature between about 250 K to about 400 K, e.g., at about 375 K, or of or greater than about 1.5 at a temperature between about 250 K to about 400 K, e.g., at about 375 K.

In certain embodiments, the method 1000 further comprises mechanically alloying elemental powders to form the powder. In some embodiments, pressing the powder as shown in operational block 1020, forms pressed pellets. For example, pressing the powder can be done by cold compaction.

In certain embodiments, sintering the powder as shown in operational block 1030 can comprise heating the powder to a first temperature for a first duration and heating the powder to a second temperature for a second duration. As an example, the powder can be heated to the first temperature before being heated to the second temperature. The first temperature can be less than the second temperature. The first temperature can be near the melting point of tin and the second temperature can be about 500° C. The first duration can be about 5 days and the second duration can also be about 5 days. In some embodiments, sintering the powder as shown in operational block 1030 can be performed under vacuum.

Figure 15:
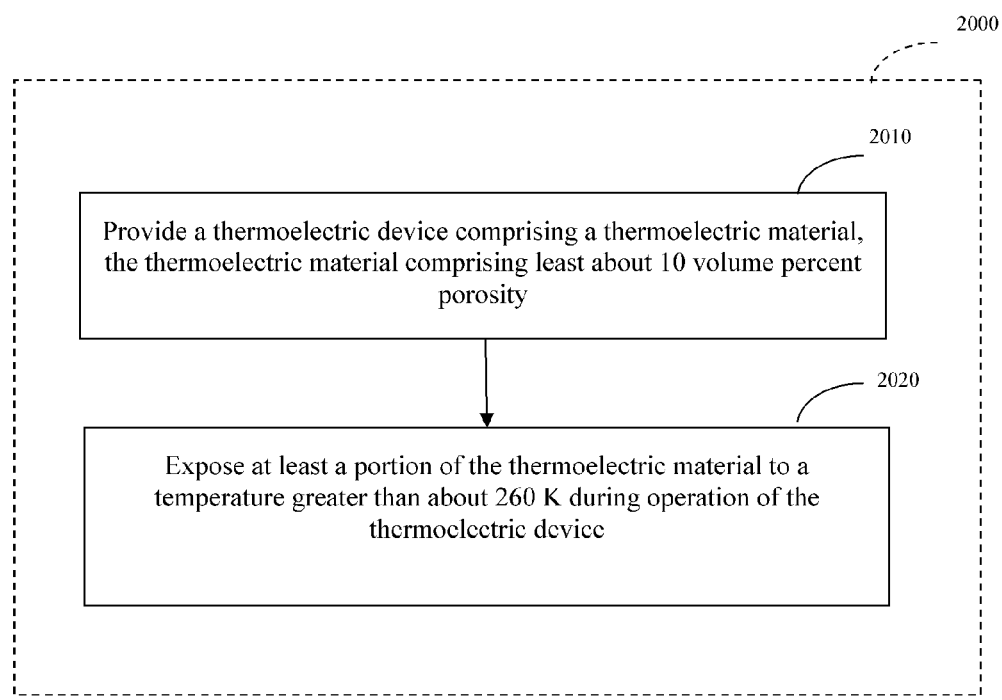
FIG. 15 is a flowchart of an example method of using a thermoelectric material in accordance with certain embodiments described herein.

FIG. 15 is a flowchart of an example method 2000 of using a thermoelectric material in accordance with certain embodiments described herein. For example, the method 2000 comprises providing a thermoelectric device, as shown in operational block 2010. The thermoelectric device comprises a thermoelectric material compatible with certain embodiments of thermoelectric materials 100 described herein. For example, in certain embodiments, the thermoelectric material 100 comprises at least about 10 volume percent porosity. In other embodiments, the thermoelectric material 100 includes at least about 15 volume percent porosity, at least about 20 volume percent porosity, at least about 25 volume percent porosity, at least about 30 volume percent porosity, at least about 35 volume percent porosity, or at least about 40 volume percent porosity. In other embodiments, the thermoelectric material 100 can include greater than about 40 volume percent porosity, e.g., at least about 45 volume percent porosity, or at least about 50 volume percent porosity.

In addition, the thermoelectric material 100 with porosity can have a zT greater than about 1.2 at a temperature between about 250 K to about 400 K, e.g., at about 375 K. As other examples, the thermoelectric material 100 with porosity can have a zT of or greater than about 1.3 at a temperature between about 250 K to about 400 K, e.g., at about 375 K, of or greater than about 1.4 at a temperature between about 250 K to about 400 K, e.g., at about 375 K, or of or greater than about 1.5 at a temperature between about 250 K to about 400 K, e.g., at about 375 K.

In certain embodiments, the method 2000 can further include exposing at least a portion of the thermoelectric material to a temperature greater than about 260 K during operation of the thermoelectric device, as shown in operational block 2020. At least a portion of the thermoelectric device can be at a temperature lower than about 260 K. As other examples, exposing at least a portion of the thermoelectric material to a temperature greater than about 260 K can include exposing at least a portion of the thermoelectric material to a temperature greater than about 270 K, greater than about 280 K, greater than about 290 K, greater than about 300 K, greater than about 310 K, greater than about 320 K, greater than about 330 K, greater than about 340 K, or greater than about 350 K. As further examples, exposing at least a portion of the thermoelectric material to a temperature greater than about 260 K can include exposing at least a portion of the thermoelectric material to a temperature greater than about 360 K, greater than about 370 K, or greater than about 375 K.

Various embodiments have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims. For example, the above techniques to form porosity in thermoelectric materials described herein can be applied to other thermoelectric materials.

What is claimed is:

1. A thermoelectric material comprising at least about 10 volume percent porosity, wherein the thermoelectric material is n-type and comprises a general composition of $(Bi_{1-x}Sb_x)_u Te_w$, wherein $0.1 \leq x \leq 0.5$, $1.8 \leq u \leq 2.2$, and $2.8 \leq w \leq 3.2$.

2. The thermoelectric material of claim 1, wherein the thermoelectric material comprises about 10 to about 40 volume percent porosity.

3. The thermoelectric material of claim 1, wherein the thermoelectric material comprises about 15 to about 25 volume percent porosity.

4. The thermoelectric material of claim 1, wherein the thermoelectric material has a zT greater than about 1.2 at a temperature of about 375 K.

5. The thermoelectric material of claim 1, wherein a substantial portion of the porosity of the thermoelectric material is closed.

6. The thermoelectric material of claim 1, wherein a substantial portion of the porosity of the thermoelectric material has a size that is between about 50 nanometers and about 10 microns.

7. The thermoelectric material of claim 1, wherein a substantial portion of the porosity of the thermoelectric material has a size that is between about 0.1 micron and about 1 micron.

8. The thermoelectric material of claim 1, wherein a substantial portion of the porosity of the thermoelectric material has a size that is between about 1 micron and about 10 microns.

9. The thermoelectric material of claim 1, wherein a substantial portion of the porosity of the thermoelectric material has a size that is larger than at least one of an electron mean free path of the thermoelectric material and a phonon mean free path of the thermoelectric material.

10. A method of making a thermoelectric material comprising:
mechanically alloying elemental powders to form a powder comprising a thermoelectric composition;
pressing the powder; and
sintering the powder to form the thermoelectric material comprising at least about 10 volume percent porosity.

11. The method of claim 10, wherein pressing the powder forms pressed pellets.

12. The method of claim 10, wherein the pressing the powder is done by cold compaction.

13. The method of claim 10, wherein sintering the powder comprises heating the powder to a first temperature for a first duration and heating the powder to a second temperature for a second duration.

14. The method of claim 13, wherein the first temperature is less than the second temperature.

15. The method of claim 13, wherein the first duration is about 5 days and the second duration is about 5 days.

16. The method of claim 13, wherein sintering is performed under vacuum.

17. A thermoelectric material comprising at least about 10 volume percent porosity, wherein the thermoelectric material comprises at least one group IV element and at least one group VI element, wherein the group IV element comprises at least one of lead and tin, and the group VI element comprises at least one of sulfur, selenium, and tellurium.

18. The thermoelectric material of claim 17, wherein the thermoelectric material comprises about 10 to about 40 volume percent porosity.

19. The thermoelectric material of claim 17, wherein the thermoelectric material comprises about 15 to about 25 volume percent porosity.

20. The thermoelectric material of claim 17, wherein the thermoelectric material has a zT greater than about 1.2 at a temperature of about 375 K.

21. The thermoelectric material of claim 17, wherein a substantial portion of the porosity of the thermoelectric material is closed.

22. The thermoelectric material of claim 17, wherein a substantial portion of the porosity of the thermoelectric material has a size that is between about 50 nanometers and about 10 microns.

23. The thermoelectric material of claim 17, wherein a substantial portion of the porosity of the thermoelectric material has a size that is between about 0.1 micron and about 1 micron.

24. The thermoelectric material of claim 17, wherein a substantial portion of the porosity of the thermoelectric material has a size that is between about 1 micron and about 10 microns.

25. The thermoelectric material of claim 17, wherein a substantial portion of the porosity of the thermoelectric material has a size that is larger than at least one of an electron mean free path of the thermoelectric material and a phonon mean free path of the thermoelectric material.

26. The thermoelectric material of claim 17, wherein the thermoelectric material is a group IV-VI compound.

27. The thermoelectric material of claim 17, wherein the thermoelectric material comprises a general composition of $(PbTe)_x(PbS)_y(SnTe)_z$, wherein $x+y+z=1$.

28. The thermoelectric material of claim 27, wherein the thermoelectric material is p-type.

29. The thermoelectric material of claim 28, wherein (1) x, z, or y+z equals zero, (2) x, y, or x+y equals zero, or (3) x, z, or x+z equals zero.

30. The thermoelectric material of claim 27, wherein the thermoelectric material is n-type.

31. The thermoelectric material of claim 30, wherein (1) y, z, or y+z equals zero, (2) x, y, or x+y equals zero, or (3) x, z, or x+z equals zero.

32. A method of making a thermoelectric material comprising:
providing a powder comprising a thermoelectric composition;
pressing the powder; and
sintering the powder to form the thermoelectric material comprising at least about 10 volume percent porosity, wherein sintering the powder comprises heating the powder to a first temperature near the melting point of tin for a first duration and heating the powder to a second temperature at about 500° C. for a second duration.

33. The method of claim 32, further comprising mechanically alloying elemental powders to form the powder.

34. The method of claim 32, wherein pressing the powder forms pressed pellets.

35. The method of claim 32, wherein the pressing the powder is done by cold compaction.

36. The method of claim 32, wherein the first duration is about 5 days and the second duration is about 5 days.

37. The method of claim 32, wherein sintering is performed under vacuum.

38. A method of making a thermoelectric material comprising:
providing a powder comprising a thermoelectric composition;
pressing the powder; and
sintering the powder to form the thermoelectric material comprising at least about 10 volume percent porosity, wherein sintering the powder comprises heating the powder to a first temperature for about 5 days and heating the powder to a second temperature for about 5 days.

39. The method of claim 38, further comprising mechanically alloying elemental powders to form the powder.

40. The method of claim 38, wherein pressing the powder forms pressed pellets.

41. The method of claim 38, wherein the pressing the powder is done by cold compaction.

42. The method of claim 38, wherein the first temperature is less than the second temperature.

43. The method of claim 38, wherein sintering is performed under vacuum.

* * * * *